(12) United States Patent
Onishi et al.

(10) Patent No.: US 7,230,511 B2
(45) Date of Patent: Jun. 12, 2007

(54) THIN FILM BULK ACOUSTIC RESONATOR, METHOD FOR PRODUCING THE SAME, FILTER, COMPOSITE ELECTRONIC COMPONENT DEVICE, AND COMMUNICATION DEVICE

(75) Inventors: Keiji Onishi, Settsu (JP); Hiroyuki Nakamura, Katano (JP); Hiroshi Nakatsuka, Katano (JP); Takehiko Yamakawa, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 37 days.

(21) Appl. No.: 10/935,160

(22) Filed: Sep. 8, 2004

(65) Prior Publication Data

US 2005/0057324 A1    Mar. 17, 2005

(30) Foreign Application Priority Data

Sep. 12, 2003  (JP) .............................. 2003-321324

(51) Int. Cl.
*H03H 9/00* (2006.01)
*H03H 9/09* (2006.01)
(52) U.S. Cl. ..................... 333/187; 333/189; 333/191
(58) Field of Classification Search ................ 333/187, 333/189, 190, 191, 188; 310/326; 438/602
See application file for complete search history.

(56) References Cited

U.S. PATENT DOCUMENTS 5,910,756 A * 6/1999 Ella ............................ 333/133
6,081,171 A * 6/2000 Ella ............................ 333/189
6,788,170 B1 * 9/2004 Kaitila et al. ............... 333/187
6,975,184 B2 * 12/2005 Wang et al. ................. 333/188
7,012,016 B2 * 3/2006 Gwo ........................... 438/602

FOREIGN PATENT DOCUMENTS

| JP | 2000-31552 | 1/2000 |
| JP | 2000-332568 | 11/2000 |
| JP | 2003-017974 | 1/2003 |

OTHER PUBLICATIONS

Kim, Sang-Hee et al., AIN-based film bulk acoustic resonator devices with W/SiO2 multilayers reflector for rf bandpass filter application, American Vacuum Society, Jul. 2001.*

* cited by examiner

*Primary Examiner*—Dean Takaoka
(74) *Attorney, Agent, or Firm*—Wenderoth, Lind & Ponack, L.L.P.

(57) ABSTRACT

A thin film bulk acoustic resonator includes a piezoelectric film, and a pair of electrodes between which the piezoelectric film is interposed. The piezoelectric film includes an outer region extending outwards from at least a portion of the periphery of a resonator portion composed of the pair of electrodes and the piezoelectric film. The outer region includes, in at least a portion thereof, an acoustic damping region for damping acoustic waves.

6 Claims, 20 Drawing Sheets

○ THIN FILM BULK ACOUSTIC RESONATOR
▨ WIRING PORTION
▨ ELECTRODE PAD

THIN FILM BULK ACOUSTIC RESONATOR

ELECTRODE PAD           ACOUSTIC DAMPING REGION

UPPER ELECTRODE        UPPER WIRING PORTION

LOWER WIRING PORTION
(POSITIONED BELOW PIEZOELECTRIC FILM)

○ THIN FILM BULK ACOUSTIC RESONATOR

ELECTRODE PAD  ACOUSTIC DAMPING REGION

UPPER ELECTRODE  UPPER WIRING PORTION

LOWER WIRING PORTION
(POSITIONED BELOW PIEZOELECTRIC FILM)

THIN FILM BULK ACOUSTIC RESONATOR, METHOD FOR PRODUCING THE SAME, FILTER, COMPOSITE ELECTRONIC COMPONENT DEVICE, AND COMMUNICATION DEVICE

BACKGROUND OF THE INVENTION

1. Field of the Invention

The present invention relates to a thin film bulk acoustic resonator, and more particularly to an improved thin film bulk acoustic resonator which effectively suppresses spurious response and which provides excellent frequency characteristics. The present also relates to a method for producing such a thin film bulk acoustic resonator. The present also relates to an improved filter which provides excellent filter characteristics by incorporating such a thin film bulk acoustic resonator. The present also relates to a composite electronic component device comprising such a filter. The present also relates to a communication device comprising such a filter and a composite electronic component device.

2. Description of the Background Art

Component elements to be internalized in an electronic device such as a mobile device are required to be reduced in size and weight. For example, a filter to be used in a mobile device must be small in size, and yet have finely-adjusted frequency characteristics.

As one type of filter satisfying such requirements, filters employing a thin film bulk acoustic resonator (Film Bulk Acoustic Resonator: FBAR) are known.

FIG. 18 is a schematic cross-sectional view showing a conventional thin film bulk acoustic resonator. In FIG. 18, the thin film bulk acoustic resonator 90 is provided upon a substrate 91. The thin film bulk acoustic resonator 90 includes a piezoelectric film 92 and an upper electrode layer 93 and a lower electrode layer 94, in such a manner that the piezoelectric film 92 is interposed between the upper electrode layer 93 and the lower electrode layer 94. A cavity 95 is formed through the substrate 91 so as to expose a lower face of the thin film bulk acoustic resonator 90, this being in order to allow free vibration of the thin film bulk acoustic resonator 90.

When an electric field is applied between the upper electrode layer 93 and the lower electrode layer 94, the electric energy is converted to a mechanical energy due to piezoelectric effects of the piezoelectric film 92. For example, in the case where a piece of aluminum nitride (AlN) having a polarization axis extending in the thickness direction is used for the piezoelectric film 92, the mechanical energy is chiefly converted to vibrations of expansion and compression along the thickness direction. In other words, owing to this mechanical energy, the piezoelectric film 92 expands and compresses in the same direction as that of the electric field.

The equivalent circuit of the thin film bulk acoustic resonator 90 is a circuit which contains a serial resonant circuit and a parallel resonant circuit. Therefore, the thin film bulk acoustic resonator 90 has a resonance frequency as well as an anti-resonance frequency. Given that the thin film bulk acoustic resonator 90 has a thickness t, the thin film bulk acoustic resonator 90 resonates with a resonance frequency $fr(=v/\lambda)$, which corresponds to a wavelength $\lambda$ satisfying $t=\lambda/2$. Here, v is a sound velocity within the material composing the thin film bulk acoustic resonator 90. Similar to the resonance frequency, the anti-resonance frequency fa is in inverse proportion to the thickness t of the thin film bulk acoustic resonator 90, and is proportional to the sound velocity within the material composing the thin film bulk acoustic resonator 90. In the case of setting the resonance frequency and/or the anti-resonance frequency in a frequency band of several hundred MHz to several GHz, any thin film bulk acoustic resonator 90 supporting such a resonance frequency and/or anti-resonance frequency will have a thickness which allows easy thin film formation at the industrial level. Therefore, in the aforementioned frequency band, the thin film bulk acoustic resonator 90 is useful as a small-sized resonator having a high Q value.

Ideally, the thin film bulk acoustic resonator 90 would only experience vibration in the thickness direction P of the piezoelectric film 92. In practice, however, vibrations along a lateral direction Q may also occur in the thin film bulk acoustic resonator 90, thus resulting in a plurality of lateral propagation modes. These lateral propagation modes are unwanted vibration modes. The lateral propagation modes propagate in a parallel direction to the electrode surfaces, undergo multiple reflections at the side walls of the piezoelectric film 92 or at the ends of the upper electrode layer 93 and the lower electrode layer 94, thus contributing to spurious response. In the case of a device including a plurality of adjoining thin film bulk acoustic resonators, the unwanted vibration modes interfere between adjoining thin film bulk acoustic resonators, and thus the unwanted vibration modes similarly contribute to spurious response. The spurious response ascribable to such lateral propagation modes deteriorates the frequency characteristics of the thin film bulk acoustic resonator.

In order to solve this problem, various techniques have been proposed (see, for example, Japanese Laid-Open Patent No. 2000-31552, and Japanese Laid-Open Patent No. 2000-332568).

FIG. 19A and FIG. 19B are schematic structural diagrams showing a conventional thin film bulk acoustic resonator which is disclosed in Japanese Laid-Open Patent No. 2000-31552. As shown in FIG. 19A, the thin film bulk acoustic resonator includes an acoustic damping material 97a (shown as a region surrounded by dotted lines in the figure), which is provided around a rectangular-shaped electrode 96a (shown as a region surrounded by solid lines in the figure), separately from the electrode 96a and the piezoelectric layer. The acoustic damping material 97a is formed through printing or the like. The acoustic damping material 97a absorbs a substantial amount of lateral-direction acoustic energy, thus alleviating the lateral-direction acoustic energy and suppressing the spurious response. As shown in FIG. 19B, the spurious response can also be suppressed by an acoustic damping material 97b (shown as a region surrounded by dotted lines in the figure) which is provided around an inequilateral rectangular-shaped electrode 96b (shown as a region surrounded by solid lines in the figure) separately from the electrode 96b and the piezoelectric layer. FIG. 19C is a graph showing the passing frequency characteristics in the case where neither acoustic damping material 97a or 97b is provided. FIG. 19D is a graph showing the passing frequency characteristics in the case where the acoustic damping material 97a or 97b is provided. As seen from FIGS. 19C and 19D, the spurious response is suppressed when the acoustic damping material 97a or 97b is provided.

FIG. 19E is a schematic structural diagram showing a conventional thin film bulk acoustic resonator which is disclosed in Japanese Laid-Open Patent No. 2000-332568. The thin film bulk acoustic resonator does not include an acoustic damping material as described above. The thin film bulk acoustic resonator includes an electrode 96c having the shape of an inequilateral non-parallel polygon (i.e., no sides are equal in length, and no sides are parallel). Due to the use of the electrode 96c having the shape of an inequilateral non-parallel polygon, the thin film bulk acoustic resonator ensures that acoustic waves 98 which originated from a point 900 on a wall are reflected at an opposite wall, thus being prevented from returning to the same point. As a result, the lateral propagation modes are damped, whereby the spurious response is suppressed.

However, in the conventional thin film bulk acoustic resonator disclosed in Japanese Laid-Open Patent No. 2000-31552, it is necessary to additionally provide the acoustic damping material 7, which complicates the production process. Furthermore, the conventional thin film bulk acoustic resonator also has a problem in that not only the unwanted vibration modes but a portion of the desired vibration mode is also damped, thus resulting in deteriorated frequency characteristics.

In the conventional thin film bulk acoustic resonator disclosed in Japanese Laid-Open Patent No. 2000-332568, it is necessary to use an electrode 96c having the shape of an inequilateral non-parallel polygon, which means that the shape of the resonator cannot be freely selected. This problematically reduces the design freedom. Specifically, when the thin film bulk acoustic resonator needs to be subjected to integration, it is difficult to obtain a high degree of integration. The unwanted vibration modes are not completely reflected at the ends of the electrodes but rather are leaked and propagated, thus unfavorably affecting an adjoining resonator.

SUMMARY OF THE INVENTION

Therefore, an object of the present invention is to provide an improved thin film bulk acoustic resonator which can efficiently suppress lateral propagation modes, without requiring a complicated production process or sacrificing design freedom. Another object of the present invention is to provide a method for producing such a thin film bulk acoustic resonator. Yet another object of the present invention is to provide an improved filter which provides excellent filter characteristics by incorporating such a thin film bulk acoustic resonator. Yet another object of the present invention is to provide a composite electronic component device comprising such a filter. Still another object of the present invention is to provide a communication device comprising such a filter.

The present invention has the following features to attain the object mentioned above. A first aspect of the present invention is directed to a thin film bulk acoustic resonator comprising: a piezoelectric film; and a pair of electrodes between which the piezoelectric film is interposed, wherein, the piezoelectric film includes an outer region extending outwards from at least a portion of a periphery of a resonator portion composed of the pair of electrodes and the piezoelectric film, and the outer region includes, in at least a portion thereof, an acoustic damping region for damping acoustic waves.

According to a first aspect of the present invention, an acoustic damping region is provided in at least a portion of the periphery of the resonator portion, so that the lateral propagation modes can be selectively damped and unfavorable influences on any adjoining resonator can be avoided. Since the acoustic damping region is formed together with the piezoelectric film composing the resonator portion, the production process is simplified. Since there are no particular limitations to the shapes of the upper electrode and the lower electrode, increased design freedom is provided.

Preferably, in the piezoelectric film, the acoustic damping region is composed of the same material as that of any region other than the acoustic damping region, and the acoustic damping region has a lower crystallinity than that of the region other than the acoustic damping region.

Thus, the acoustic damping region and the region other than the acoustic damping region are composed of the same material, so that both regions have substantially the same acoustic impedance. As a result, the lateral propagation modes are allowed to reach the acoustic damping region, where they are damped. Since the acoustic damping region can be formed by a simple method of lowering crystallinity, the production process is simplified.

For example, the acoustic damping region has a greater full width at half maximum (FWHM) of an X-ray diffraction rocking curve than that of the region of the piezoelectric film other than the acoustic damping region.

Thus, it is possible to easily ascertain whether an acoustic damping region has been formed or not.

For example, a stepped portion is formed on a surface of any element immediately underlying the acoustic damping region.

Thus, when the piezoelectric film is deposited, the crystallinity of the piezoelectric film formed on the stepped portion is deteriorated due to the influence of the stepped portion, whereby the acoustic damping region is formed.

For example, any element immediately underlying the acoustic damping region has a coarser surface than that of a lower one of the pair of electrodes of the resonator portion.

Thus, the portion of the piezoelectric film which is formed on any element immediately underlying the acoustic damping region has a lowered crystallinity.

For example, a difference between a lattice constant of the piezoelectric film in the resonator portion and a lattice constant of the piezoelectric film in the acoustic damping region is greater than a difference between the lattice constant of the piezoelectric film in the resonator portion and a lattice constant of the piezoelectric film in any region other than the acoustic damping region.

Thus, the portion of the piezoelectric film which is formed on any element immediately underlying the acoustic damping region has a lowered crystallinity.

For example, the acoustic damping region includes homogenous atoms or heterogenous atoms not existing in any region of the piezoelectric film other than the acoustic damping region.

Thus, the piezoelectric film has a lowered crystallinity. Moreover, an acoustically discontinuous portion can be formed which has a random shape with respect to directions in the plane of the surface of the resonators or the thickness direction, thus making it possible to diffuse the unwanted vibration modes.

For example, homogenous ions or heterogenous ions not existing in any region of the piezoelectric film other than the acoustic damping region are implanted into the acoustic damping region.

Thus, the piezoelectric film has a lowered crystallinity. Moreover, an acoustically discontinuous portion can be formed which has a random shape with respect to directions in the plane of the surface of the resonators or the thickness direction, thus making it possible to diffuse the unwanted vibration modes.

For example, the acoustic damping region includes a laser irradiation scar.

Thus, the portion of the piezoelectric film having the laser irradiation scar has a lowered crystallinity.

A second aspect of the present invention is directed to a method for producing a thin film bulk acoustic resonator, comprising the steps of: forming a lower electrode on or above a substrate; forming a piezoelectric film on or above the lower electrode; and forming an upper electrode on or above the piezoelectric film, wherein, the step of forming the piezoelectric film comprises: forming the piezoelectric film so as to have a region extending outwards from at least a portion of a periphery of a resonator portion composed of the upper electrode, the lower electrode, and the piezoelectric film; and ensuring that at least a portion of the region of the piezoelectric film extending outwards has a lower crystallinity than that of the resonator portion of the piezoelectric film, thereby forming an acoustic damping region for damping acoustic waves.

Thus, the acoustic damping region can be formed through a simple production process.

For example, the method may further comprise a step of forming a stepped portion in a part of a surface of any element immediately underlying the piezoelectric film, wherein the piezoelectric film is also formed on the stepped portion in the step of forming the piezoelectric film, whereby the acoustic damping region is formed.

For example, the method may further comprise a step of roughening a part of a surface of any element immediately underlying the piezoelectric film, wherein the piezoelectric film is also formed on the roughened part of the surface in the step of forming the piezoelectric film, whereby the acoustic damping region is formed.

For example, the method may further comprise a step of adjusting a material and/or conditions for forming any element immediately underlying the piezoelectric film so that a difference between a lattice constant of the piezoelectric film in the resonator portion and a lattice constant of a part of a surface of the element corresponding to the acoustic damping region is greater than a difference between the lattice constant of the piezoelectric film in the resonator portion and a lattice constant of a part of the surface of the element corresponding to any region other than the acoustic damping region, and wherein the piezoelectric film is also formed on the part of the surface of the element corresponding to the acoustic damping region in the step of forming the piezoelectric film, whereby the acoustic damping region is formed.

For example, in the step of forming the piezoelectric film, a laser beam is irradiated onto a region in which to form the acoustic damping region, whereby the acoustic damping region is formed.

For example, in the step of forming the piezoelectric film, atoms are thermally diffused from the exterior into a region in which to form the acoustic damping region, whereby the acoustic damping region is formed.

For example, in the step of forming the piezoelectric film, ions are additionally implanted into a region in which to form the acoustic damping region, whereby the acoustic damping region is formed.

Thus, during or after the deposition of the piezoelectric film, the piezoelectric film has a lowered crystallinity, whereby the acoustic damping region is formed.

A third aspect of the present invention is directed to a thin film bulk acoustic resonator filter comprising a plurality of interconnected thin film bulk acoustic resonators, each thin film bulk acoustic resonator including: a piezoelectric film; and an upper electrode and a lower electrode between which the piezoelectric film is interposed, wherein, the piezoelectric film in at least one of the plurality of thin film bulk acoustic resonators includes an outer region extending outwards from at least a portion of a periphery of a resonator portion composed of the upper electrode, the lower electrode, and the piezoelectric film, the outer region includes, in at least a portion thereof, an acoustic damping region (50c, 50d) for damping acoustic waves, and the acoustic damping region is provided at least between those of the plurality of thin film bulk acoustic resonators having different resonance frequencies.

Thus, the influence of lateral propagation modes can be suppressed between thin film bulk acoustic resonators having different resonance frequencies.

Preferably, the piezoelectric film in each thin film bulk acoustic resonator is a continuous or discontinuous part of a common piezoelectric film, and any region of the common piezoelectric film other than regions corresponding to the resonator portions constitutes the acoustic damping region.

Thus, the influence of lateral propagation modes can be suppressed between all thin film bulk acoustic resonators.

A fourth aspect of the present invention is directed to a composite electronic component device comprising a thin film bulk acoustic resonator filter including a plurality of interconnected thin film bulk acoustic resonators, each thin film bulk acoustic resonator including: a piezoelectric film; and an upper electrode and a lower electrode between which the piezoelectric film is interposed, wherein, the piezoelectric film in at least one of the plurality of thin film bulk acoustic resonators includes an outer region extending outwards from at least a portion of a periphery of a resonator portion composed of the upper electrode, the lower electrode, and the piezoelectric film, the outer region includes, in at least a portion thereof, an acoustic damping region for damping acoustic waves, and the acoustic damping region is provided at least between those of the plurality of thin film bulk acoustic resonators having different resonance frequencies.

A fifth aspect of the present invention is directed to a communication device comprising a thin film bulk acoustic resonator filter including a plurality of interconnected thin film bulk acoustic resonators, each thin film bulk acoustic resonator including: a piezoelectric film; and an upper electrode and a lower electrode between which the piezoelectric film is interposed, wherein, the piezoelectric film in at least one of the plurality of thin film bulk acoustic resonators includes an outer region extending outwards from at least a portion of a periphery of a resonator portion composed of the upper electrode, the lower electrode, and the piezoelectric film, the outer region includes, in at least a portion thereof, an acoustic damping region (50c, 50d) for damping acoustic waves, and the acoustic damping region is provided at least between those of the plurality of thin film bulk acoustic resonators having different resonance frequencies.

Thus, according to the present invention, an acoustic damping region is provided in at least a portion of the periphery of the resonator portion, so that the lateral propagation modes can be selectively damped and unfavorable influences on any adjoining resonator can be avoided. Since the acoustic damping region is formed together with the piezoelectric film composing the resonator portion, the production process is simplified. Since there are no particular limitations to the shapes of the upper electrode and the lower electrode, increased design freedom is provided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12B is a diagram illustrating a cross-sectional structure in the case where an insulating film 15c is formed on a substrate 15 so as to exclude a cavity portion, such that the substrate 15 and the insulating film 15c together define a cavity 24a;

FIG. 12C is a diagram illustrating a cross-sectional structure in the case where a thin film bulk acoustic resonator is provided on a support 15b having an aperture therein, the support 15b being provided on an insulating film 15d which is formed on the entire surface of a substrate 15a;

DESCRIPTION OF THE PREFERRED EMBODIMENTS (First Embodiment)

Figure 1:
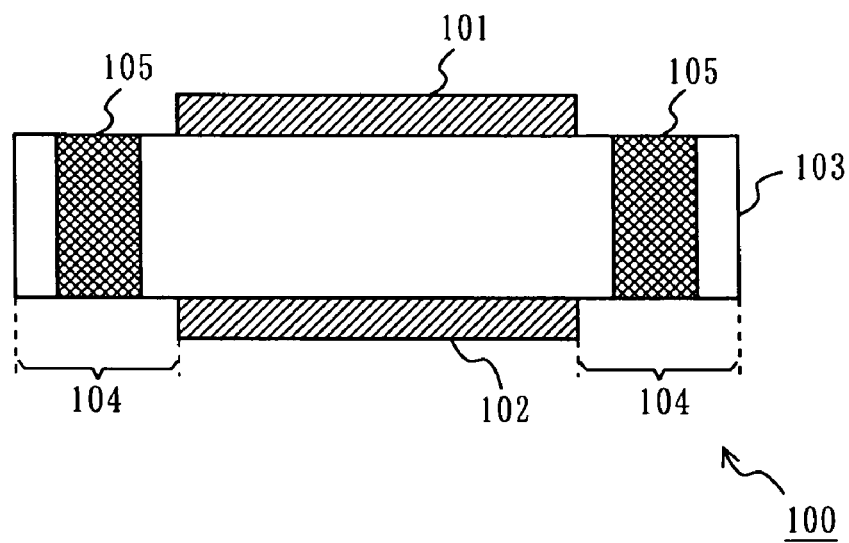
FIG. 1 is a cross-sectional view showing a thin film bulk acoustic resonator 100 according to a first embodiment of the present invention.

FIG. 1 is a cross-sectional view showing a thin film bulk acoustic resonator 100 according to a first embodiment of the present invention. Referring to FIG. 1, the thin film bulk acoustic resonator 100 comprises an upper electrode 101, a lower electrode 102, and a piezoelectric film 103. The piezoelectric film 103 includes outer regions 104 which extend outward from the periphery of a resonator portion which is constructed in a region interposed by the pair of electrodes (i.e., the upper and lower electrodes 101 and 102).

Each outer region 104 includes, in a portion thereof, an acoustic damping region 105 for damping acoustic waves from the resonator portion.

The piezoelectric film 103 is composed of a suitable piezoelectric material such as zinc oxide (ZnO), lead zirconate titanate (PZT), aluminum nitride (AlN), or the like.

The upper electrode 101 and the lower electrode 102 are composed of a suitable material such as molybdenum (Mo), tungsten (W), aluminum (Al), titanium (Ti), copper (Cu), platinum (Pt), gold (Au), or the like.

The acoustic damping regions 105 are portions of the piezoelectric film 103, and therefore are composed of the same material as that of the piezoelectric film 103. However, the acoustic damping regions 105 have a lower crystallinity than that of any other region of the piezoelectric film 103.

In the present specification, the term "crystallinity" is used as a measure of regularity with which molecules of a crystallized substance are aligned. When a first region is said to have a lower crystallinity than that of a second region, it is meant that the molecules are less regularly aligned in the first region than in the second region.

The crystallinity of a piezoelectric film can be evaluated in terms of crystal orientation. Poor orientation means poor crystallinity. In turn, the orientation of a piezoelectric film can be evaluated in terms of FWHM (full width at half maximum) of a rocking curve of X-ray diffraction or the like. Poor orientation results in a relatively large FWHM, and good orientation results in a relatively small FWHM. In general, when a piezoelectric film of aluminum nitride (AlN) or the like is formed by sputtering, an FWHM of about 1.0 to 1.5 degrees can be obtained. In such a case, it is preferable that the acoustic damping regions 105 have an FWHM of 5 degrees or more.

Figure 2:
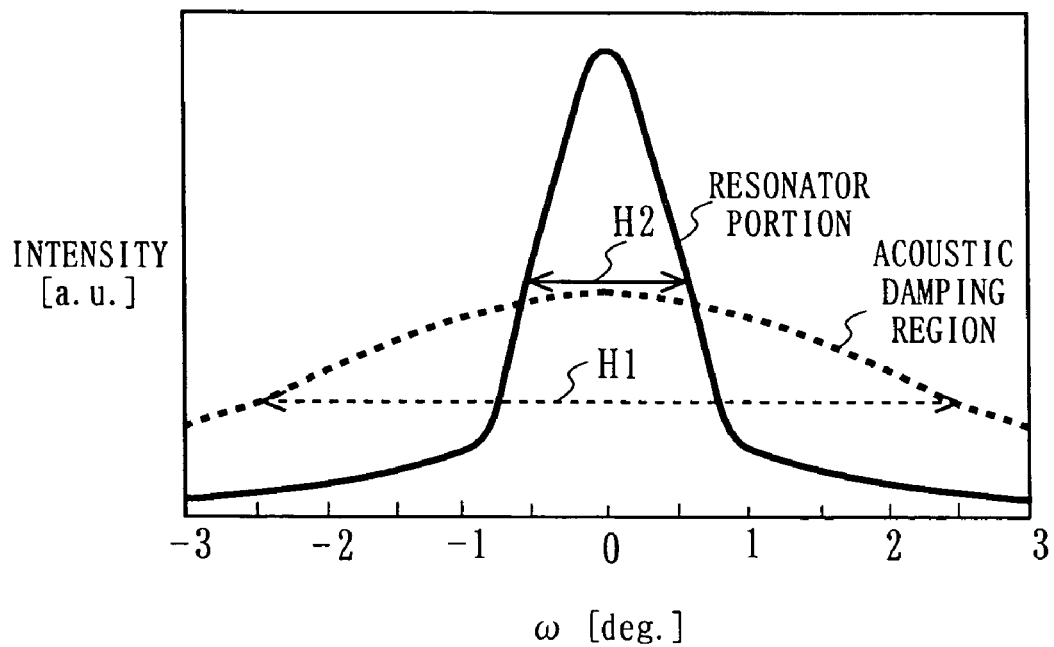
FIG. 2 is a graph, with respect to a piezoelectric film 103, showing an XRD (X-Ray Diffraction) rocking curve (shown by a solid line) of a resonator portion interposed between an upper electrode 101 and a lower electrode 102, as well as an XRD rocking curve (shown by a dotted line) of acoustic damping regions 105.

FIG. 2 is a graph, with respect to the piezoelectric film 103, showing an XRD (X-Ray Diffraction) rocking curve (shown by a solid line) of the resonator portion interposed between the upper electrode 101 and the lower electrode 102, as well as an XRD rocking curve (shown by a dotted line) of the acoustic damping regions 105. As shown in FIG. 2, the acoustic damping regions 105 have an FWHM (H1) which is greater than an FWHM (H2) of the region other than the acoustic damping regions 105. In other words, the acoustic damping regions 105 have a greater FWHM of the XRD rocking curve than in the region other than the acoustic damping regions 105, meaning that the acoustic damping regions 105 have a poorer orientation than that in the region other than the acoustic damping regions 105. In other words, the acoustic damping regions 105 have a lower crystallinity than that of the region other than the acoustic damping regions 105. Thus, by measuring an XRD rocking curve and deriving an FWHM value, it is possible to evaluate whether the acoustic damping regions 105 have a low crystallinity or not.

Crystallinity can also be evaluated based on the refractive index of the piezoelectric film, e.g., based on how much difference exists between the refractive index of a piezoelectric film for evaluation and the refractive index of a piezoelectric film which has been formed ideally well. If the piezoelectric film for evaluation has a refractive index which is quite different from the refractive index of the ideal piezoelectric film, the crystallinity of the piezoelectric film for evaluation is considered low. Therefore, if the refractive index of the acoustic damping regions 105 is different from the refractive index of the region other than the acoustic damping regions 105, it can be said that the acoustic damping regions 105 has a lower crystallinity than that of the region other than the acoustic damping regions 105. Thus, by measuring the refractive index, it is possible to evaluate whether the acoustic damping regions 105 have a low crystallinity or not.

Crystallinity can also be evaluated based on the hardness of the piezoelectric film. If the acoustic damping regions 105 are not as hard as the region other than the acoustic damping regions 105, it can be said that the acoustic damping regions 105 have a lower crystallinity than that of the region other than the acoustic damping regions 105.

If the production steps which are described further below are adopted, the acoustic damping regions 105 can be concurrently formed at the time of forming the piezoelectric film 103, so that no complicated processes are required for the formation of the acoustic damping regions 105.

As described above, in the first embodiment, the acoustic damping regions 105 have a lower crystallinity than that of any region of the piezoelectric film 103 other than the acoustic damping regions 105. As compared to any region having a good crystallinity, the acoustic damping regions 105 can greatly damp acoustic waves. Therefore, even in the case where lateral propagation modes exist, the acoustic waves from a portion of the piezoelectric film 103 corresponding to the resonator portion interposed between the upper electrode 101 and the lower electrode 102 are damped in the acoustic damping regions 105. As a result, the thin film bulk acoustic resonator 100 can selectively damp the unwanted lateral propagation modes (i.e., modes which are propagated along the lateral direction), without affecting the main vibration (thickness vibration) along the thickness direction P. As a result, the influences on any other adjoining thin film bulk acoustic resonator can be minimized.

Moreover, according to the first embodiment, the planar shapes of the upper electrode 101 and the lower electrode 102 do not need to be inequilateral non-parallel polygons. Thus, the shape of the resonator can be freely chosen (e.g., a circle, or an equilateral polygon), thereby allowing for increased design freedom.

As compared to conventional techniques which apply an acoustic damping material by printing or the like, the acoustic damping regions can be formed with a high precision even in the case where there is little interspace between resonators.

Note that the outer regions 104 must extend outwards from at least a portion of the periphery of the resonator portion interposed by the upper electrode 101 and the lower electrode 102 resonator. In other words, the outer regions 104 do not need to be formed entirely around the periphery of the resonator portion.

Note that the acoustic damping regions 105 do not need to be formed in the entirety of the outer regions 104. Rather, an acoustic damping region 105 formed in at least a portion of an outer region 104 can provide the effect of lateral propagation modes attenuation.

Although the above illustrates an example where sound wave attenuation is attained by prescribing a lower crystallinity for the acoustic damping regions 105 than for any other region, it will be appreciated that such a limitation concerning crystallinity can be omitted so long as acoustic waves can be damped by some other principle.

(Second Embodiment)

Figure 3A:
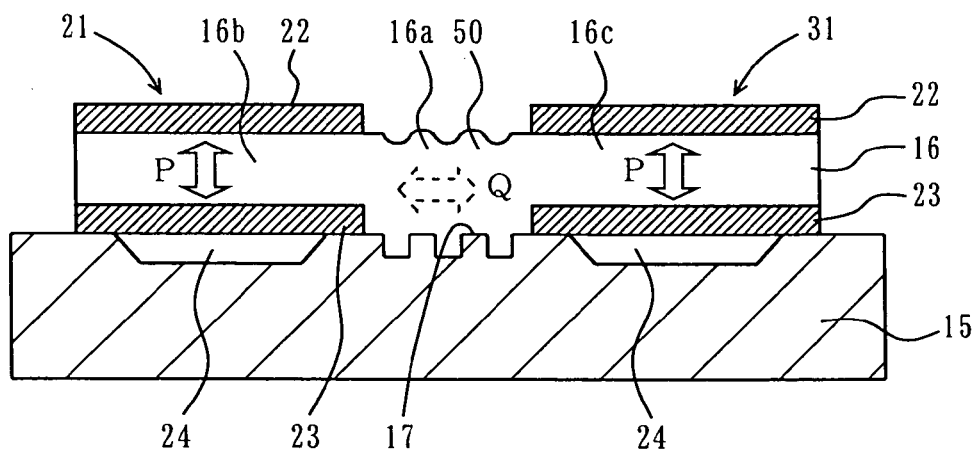
FIG. 3A is a cross-sectional view showing a thin film bulk acoustic resonator according to a second embodiment of the present invention.
Figure 3B:
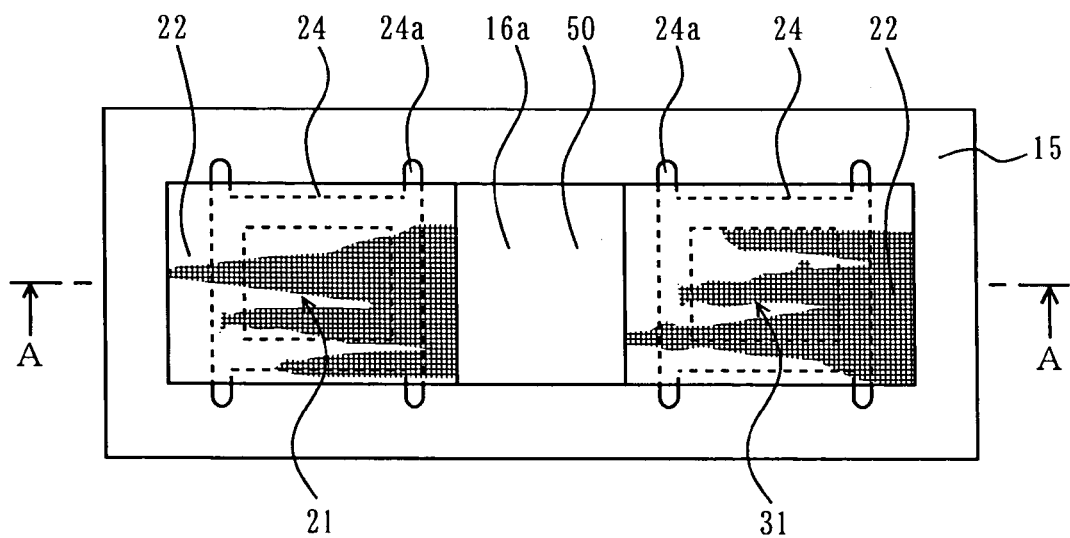
FIG. 3B is an upper plan view showing the thin film bulk acoustic resonator according to the second embodiment of the present invention.

FIG. 3A is a cross-sectional view showing a thin film bulk acoustic resonator according to a second embodiment of the present invention. FIG. 3B is an upper plan view showing the thin film bulk acoustic resonator according to the second embodiment of the present invention. FIG. 3A provides a cross-sectional view taken along line A—A in FIG. 3B.

Referring to FIGS. 3A and 3B, the thin film bulk acoustic resonator according to the second embodiment comprises a first thin film bulk acoustic resonator 21, a second thin film bulk acoustic resonator 31, an acoustic damping region 50, and a substrate 15. On the upper face of the substrate 15, two cavities 24 are provided corresponding to the first and second thin film bulk acoustic resonators 21 and 31, respectively. Corresponding to the first and second thin film bulk acoustic resonators 21 and 31, respectively, two lower electrodes 23 are provided so as to cover the two cavities 24. On the substrate 15, a piezoelectric film 16 which is common to the first and second thin film bulk acoustic resonators 21 and 31 is provided so as to cover the two lower electrodes 23. On the common piezoelectric film 16, two upper electrodes 22 are provided so as to respectively correspond to the first and second thin film bulk acoustic resonators 21 and 31. Thus, the first and second thin film bulk acoustic resonators 21 and 31 are disposed so as to respectively overlay the two cavities 24.

The common piezoelectric film 16 is composed of a suitable piezoelectric material such as zinc oxide (ZnO), lead zirconate titanate (PZT), aluminum nitride (AlN), or the like.

The upper electrode 22 and the lower electrode 23 are composed of a suitable material such as molybdenum (Mo), tungsten (W), aluminum (Al), titanium (Ti), copper (Cu), platinum (Pt), gold (Au), or the like.

The substrate 15 may be composed of a material such as silicon (Si) or glass. Although not explicitly shown, in the case where a semiconductor material such as Si is used for the substrate 15, it is preferable to provide an insulating film between the lower electrode 23 and the substrate 15 (the same is also true to any other embodiment), in order to insulate the lower electrode 23 from the substrate 15. As a material of the insulating film, siliconoxide ($SiO_2$) or silicon nitride ($Si_3N_4$) may used, for example. Alternatively, a piezoelectric film of aluminum nitride (AlN) or the like may be used as the insulating film. In this case, a stepped portion is to be provided in a portion of the surface of the insulating film located below the piezoelectric film portion 16a constituting at least a portion of the periphery of each of the first and second thin film bulk acoustic resonators 21 and 31 and extending outwards therefrom.

The two cavities 24 are formed in the surface of the substrate 15 at positions which are respectively below the first and second thin film bulk acoustic resonators 21 and 31. Note that each of the first and second thin film bulk acoustic resonators 21 and 31 does not entirely cover the corresponding cavity 24. Rather, each cavity 24 has exposed portions 24a. The function of these potions 24a of the cavity 24 will be described later.

The acoustic damping region 50 is a portion of the common piezoelectric film 16. Specifically, the acoustic damping region 50 accounts for at least part of a piezoelectric film portion 16a, which is an area present between the adjoining first and second thin film bulk acoustic resonators 21 and 31. It will be seen that the piezoelectric film portion 16a is an area which constitutes at least a portion of the periphery of each of the first and second thin film bulk acoustic resonators 21 and 31 and which extends outwards therefrom. The piezoelectric film portion 16a corresponds to the "outer regions" according to the first embodiment. The acoustic damping region 50 of the piezoelectric film portion 16a is composed of the same material as that of piezoelectric film portions 16b and 16c which are comprised by the first and second thin film bulk acoustic resonators 21 and 31, respectively. The acoustic damping region 50 has a lower crystallinity than that of the piezoelectric film portions 16b and 16c comprised by the first and second thin film bulk acoustic resonators 21 and 31, respectively. As described later, the crystallinity of the piezoelectric film portion 16a can be lowered by providing a stepped portion 17 on the surface of the substrate 15.

Thus, according to the second embodiment, the piezoelectric film portion 16a is composed of the same material as that of the piezoelectric film portions 16b and 16c respectively comprised by the first and second thin film bulk acoustic resonators 21 and 31, so that an acoustic impedance of the piezoelectric film portion 16a and an acoustic impedance of the piezoelectric film portions 16b and 16c are substantially equal. However, the piezoelectric film portion 16a has a lower crystallinity than that of the piezoelectric film portions 16b and 16c comprised by the first and second thin film bulk acoustic resonators 21 and 31, respectively. In a region having a lowered crystallinity, the acoustic waves are greatly damped relative to any region having a good crystallinity. Thus, the piezoelectric film portion 16a functions as the acoustic damping region 50. Even if lateral propagation modes exist, acoustic waves traveling from the piezoelectric film portions 16b and 16c to the piezoelectric film portion 16a are damped within the acoustic damping region 50. As a result, without affecting the main vibration (thickness vibration) along the thickness direction P, the lateral propagation modes propagating along the lateral direction Q, which are unwanted vibration mode, can be selectively damped. Thus, the influence on each of the adjoining thin film bulk acoustic resonators can be minimized.

Moreover, the planar shapes of the upper electrodes 22 and the lower electrodes 23 do not need to be inequilateral non-parallel polygons. Thus, the shape of each resonator can be freely chosen (e.g., a circle, or an equilateral polygon), thereby allowing for increased design freedom. As compared to conventional techniques which apply an acoustic damping material by printing or the like, the acoustic damping regions can be formed with a high precision even in the case where there is little interspace between resonators.

Although the second embodiment illustrates an example containing two adjoining thin film bulk acoustic resonators, similar effects can be obtained for a resonator composed of three or more thin film bulk acoustic resonators, by ensuring that each thin film bulk acoustic resonator includes an acoustic damping region. Moreover, similar effects can be obtained for a device in which two or more thin film bulk acoustic resonators are integrated (e.g., a filter) by ensuring that each thin film bulk acoustic resonator includes an acoustic damping region. Preferably, an acoustic damping region is constructed between two adjoining thin film bulk acoustic resonators.

Although the second embodiment illustrates an example where a rectangular-shaped stepped portion 17 is formed, the shape of the stepped portion is not limited thereto. The stepped portion may be tapered (obtained by forming a slanted portion on the substrate) (not shown), or have a gently undulated shape (not shown), to obtain similar effects. The stepped portion does not need to contain a series of steps, but may contain a single step dividing between a higher level and a lower level. For example, a difference may be provided between the level of a region of the substrate 15 in which the first thin film bulk acoustic resonator 21 is disposed and the level of a region of the substrate 15 in which the second thin film bulk acoustic resonator 31 is disposed, and this level difference may be used as a stepped portion between the first and second thin film bulk acoustic resonators 21 and 31 to define an acoustic damping region.

In the case where two thin film bulk acoustic resonators are disposed so as to adjoin each other, more outstanding effects can be obtained if the resonators have respectively different resonance frequencies, or if the resonators are disposed so that laterally-propagating sound wave modes propagating therethrough have the same phase. The reason is that, while two acoustic waves having the same frequency and opposite phases (180° apart) can be expected to cancel each other, any two acoustic waves not satisfying such a relationship are likely to strengthen each other, thus giving all the more reason for requiring an acoustic damping region between the resonators to prevent or suppress the problem.

(Method for Producing the Thin Film Bulk Acoustic Resonator of the Second Embodiment)

FIGS. 4A, 4B, 4C, 4D, 4E, 4F, and 4G are cross-sectional views illustrating a method for producing the thin film bulk acoustic resonator according to the second embodiment of the present invention. Hereinafter, referring to FIGS. 4A to 4G, a method for producing the thin film bulk acoustic resonator according to the second embodiment of the present invention will be described.

Figure 4A:
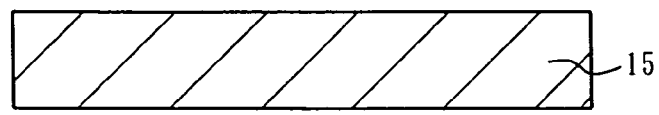
FIGS. 4A, 4B, 4C, 4D, 4E, 4F, and 4G are cross-sectional views illustrating a method for producing the thin film bulk acoustic resonator according to the second embodiment of the present invention.

First, as shown in FIG. 4A, a substrate 15 is prepared.

Figure 4B:
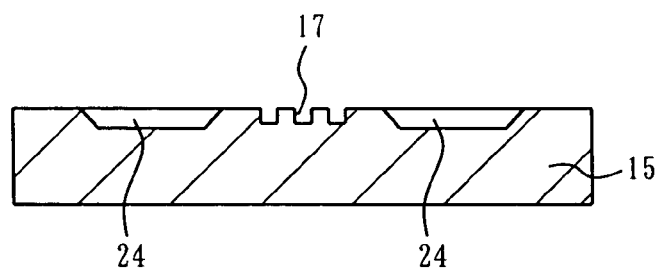

Next, as shown in FIG. 4B, two cavities 24 and a stepped portion 17 are formed on the surface of the substrate 15. Note that the two cavities 24 are placed apart from each other on the surface of the substrate 15. The stepped portion 17 is positioned on a portion of the surface of the substrate 15 which is located below a region where an acoustic damping region 50 is to be formed.

Figure 4C:
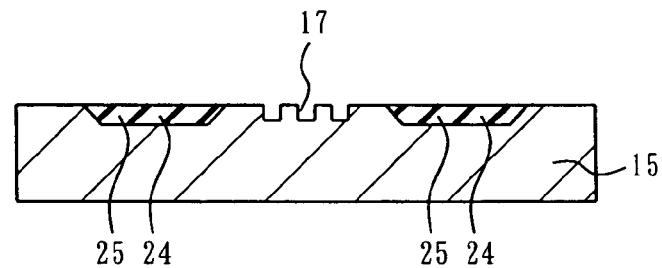

Next, as shown in FIG. 4C, a sacrificial layer 25, which can be removed later, is embedded in each of the two cavities 24. The sacrificial layers 25 are composed of, for example, an easily-soluble material such as phosphosilicate glass (PSG).

Figure 4D:
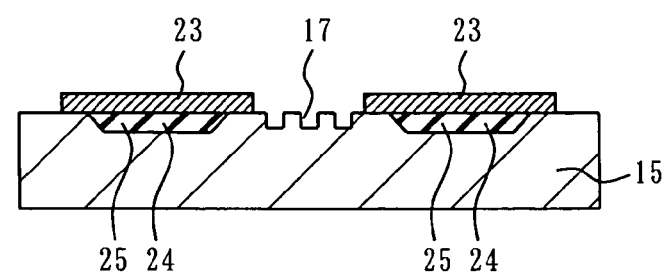

Next, as shown in FIG. 4D, two lower electrodes 23 are formed on the substrate 15 so as to lie across the respective cavities 24.

Figure 4E:
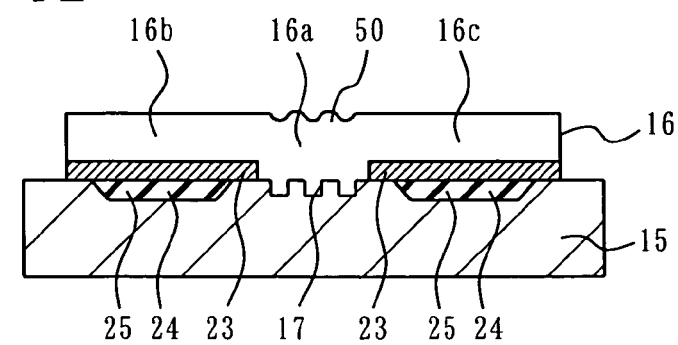

Next, as shown in FIG. 4E, a common piezoelectric film 16 is deposited on the substrate 15 so as to cover the lower electrodes 23, by sputtering or CVD, etc. When the piezoelectric film 16 is deposited, the piezoelectric film portion 16a formed above the stepped portion 17 is affected by the stepped portion 17 so as to partially lose its lattice regularity. On the other hand, the piezoelectric film portions 16b and 16c comprised by the first and second thin film bulk acoustic resonators 21 and 31, respectively, are formed so as to conserve the lattice regularity in the two lower electrodes 23. As a result, the piezoelectric film portion 16a has a lower crystallinity than that of the other piezoelectric film portions 16b and 16c, which are respectively comprised by the thin film bulk acoustic resonators 21 and 31. Thus, the acoustic damping region 50 is formed.

Figure 4F:
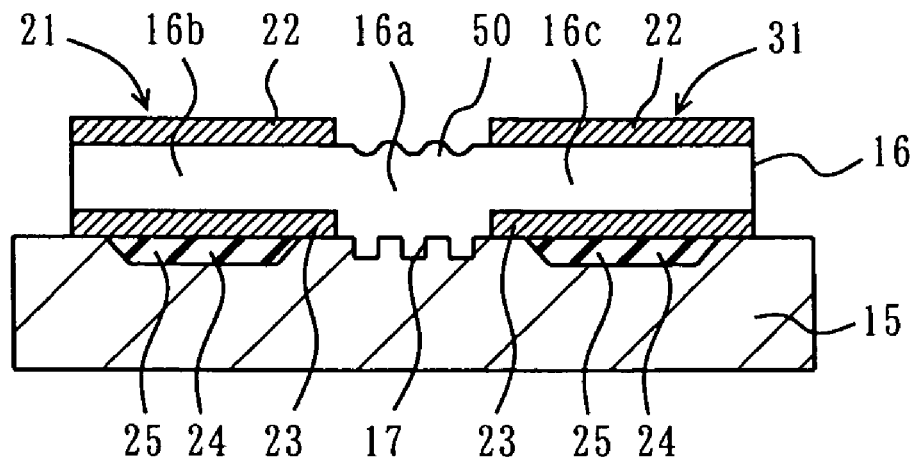

Next, as shown in FIG. 4F, on the common piezoelectric film 16, an upper electrode 22 for the first thin film bulk acoustic resonator 21 and an upper electrode 22 for the second thin film bulk acoustic resonator 31 are formed so as to be apart from each other.

Figure 4G:
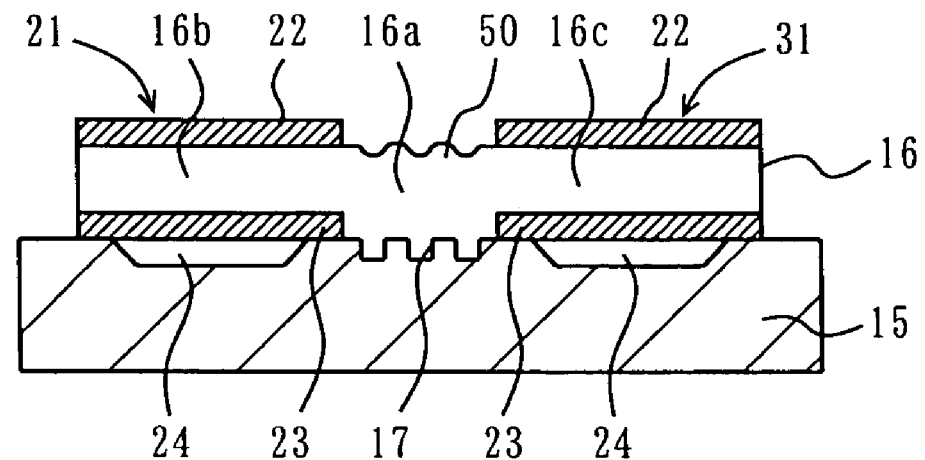

Finally, as shown in FIG. 4G, the sacrificial layer 25 in each cavity 24 is removed via the four exposed portions 24a (see FIG. 3B) so as to leave a hollow space. The sacrificial layer 25 may be removed by being dissolved with an aqueous solution of hydrogen fluoride or by using any other method.

Thus, according to the present producing method, the acoustic damping region 50 can be formed by a simple method of forming a stepped portion 17 on the substrate 15. In other words, the acoustic damping region 50 can be formed without the need to employ any additional acoustic damping material, thus facilitating the production process for the thin film bulk acoustic resonator furnished with the acoustic damping region 50. Stated otherwise, other than the formation of the stepped portion 17 on the substrate 15, the thin film bulk acoustic resonator according to the second embodiment can be produced by a method similar to the production process for a conventional thin film bulk acoustic resonator.

(Third Embodiment)

Figure 5:
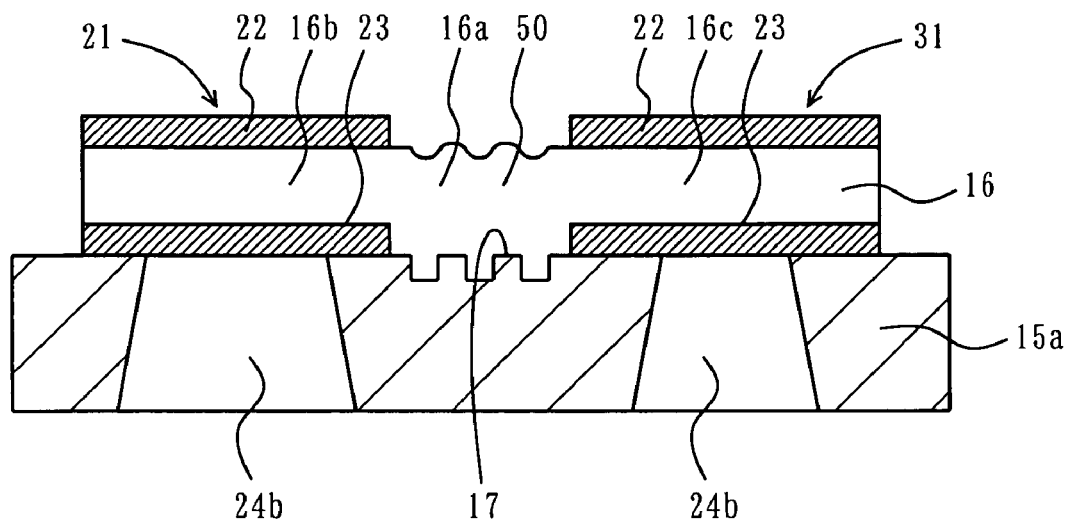
FIG. 5 is a cross-sectional view showing a thin film bulk acoustic resonator according to a third embodiment of the present invention.

FIG. 5 is a cross-sectional view showing a thin film bulk acoustic resonator according to a third embodiment of the present invention. In FIG. 5, any portion which is similar or corresponds to a counterpart in the thin film bulk acoustic resonator as shown in FIGS. 3A and 3B is denoted by the same reference numeral as that used in FIGS. 3A and 3B, and the descriptions thereof are omitted.

As shown in FIG. 5, in the third embodiment, cavities 24b are formed so as to penetrate through the substrate 15a. Thus, even in the case where the cavities are not only formed in the surface of the substrate but penetrate through the substrate, similar effects to those described above can be obtained.

According to the producing method shown in FIGS. 4A to 4G, it is necessary to first embed a sacrificial layer 25 in each cavity 24 formed in the surface of the substrate 15, form lower electrodes 23, a piezoelectric film 16, upper electrodes 22 on the sacrificial layer 25, and then remove the sacrificial layers 25 from within the cavities 24 to form hollow spaces. However, in accordance with the thin film bulk acoustic resonator of the third embodiment, the cavities 24b can be easily formed by simply allowing them to penetrate through the substrate 15 after the first thin film bulk acoustic resonator 21 and the second thin film bulk acoustic resonator 31 are completed.

(Fourth Embodiment)

Figure 6:
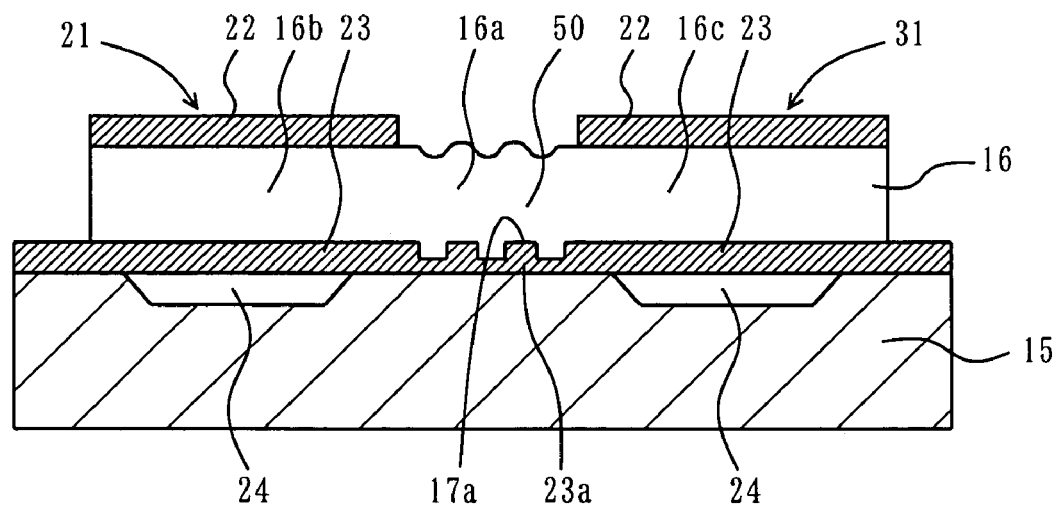
FIG. 6 is a cross-sectional view showing a thin film bulk acoustic resonator according to a fourth embodiment of the present invention.

FIG. 6 is a cross-sectional view showing a thin film bulk acoustic resonator according to a fourth embodiment of the present invention. In FIG. 6, any portion which is similar or corresponds to a counterpart in the thin film bulk acoustic resonator as shown in FIGS. 3A and 3B is denoted by the same reference numeral as that used in FIGS. 3A and 3B, and the descriptions thereof are omitted.

As shown in FIG. 6, in the fourth embodiment, a stepped portion 17a is provided on the surface of an underlying electrode 23a, which is connected to two adjoining lower electrodes 23. In the fourth embodiment, by sputtering or CVD, a common piezoelectric film 16 is deposited so as to cover the two lower electrodes 23 and the underlying electrode 23a. Thus, by providing a stepped portion 17a in a portion of the underlying electrode 23a located below a region where an acoustic damping region 50 is to be formed, the acoustic damping region 50 can be formed.

Although FIG. 6 illustrates an example where a portion connecting adjoining lower electrodes 23 is stepped, it is not a requirement that adjoining lower electrodes 23 be connected to each other. In the case where the adjoining lower electrodes 23 are not connected to each other, a piece of electrode material in a region where a stepped portion is required may be patterned in a manner similar to the underlying electrode 23a, whereby the stepped portion can be obtained. Alternatively, after an underlying electrode for connecting the adjoining lower electrodes 23 is formed, the same electrode material as the underlying electrode material or a different material from the underlying electrode material may be patterned into a stepped portion.

When the piezoelectric film 16 is deposited, the piezoelectric film portion 16a formed above the stepped portion 17a of the underlying electrode 23a is affected by the stepped portion 17a so as to partially lose its lattice regularity. On the other hand, the piezoelectric film portions 16b and 16c are formed so as to conserve the lattice regularity in the lower electrodes 23. As a result, the piezoelectric film portion 16a has a lower crystallinity than that of the other piezoelectric film portions 16b and 16c, thus defining the acoustic damping region 50. The acoustic waves propagating through the piezoelectric film 16 along the lateral direction are damped upon entry into the acoustic damping region 50. As a result, the lateral propagation modes can be selectively damped, thus minimizing the influence on each of the adjoining thin film bulk acoustic resonators.

Although the second to fourth embodiments above each illustrate an example where the main element composing the stepped portion is the substrate 15 or the underlying electrode 23a, there is no limitation as to the main element composing the stepped portion so long as the stepped portion is formed on a face at which the piezoelectric film portion 16a defining the acoustic damping region 50 comes in contact with the substrate 15. The element composing the stepped portion does not need to be a single element, but may comprise a plurality of elements so long as steps are formed. For example, by partially patterning an electrode onto the substrate 15, a stepped portion composed of the substrate 15 and the patterned electrode can be obtained.

(Fifth Embodiment)

Figure 7A:
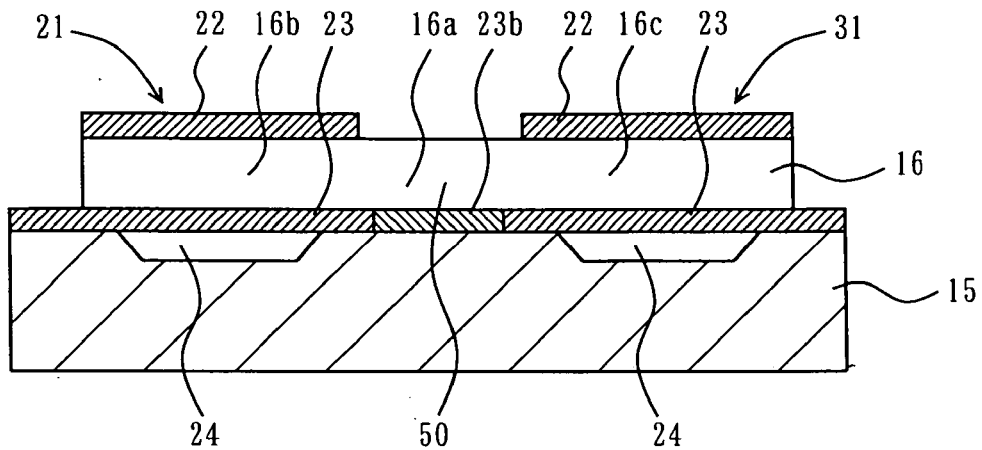
FIG. 7A is a cross-sectional view showing a thin film bulk acoustic resonator according to a fifth embodiment of the present invention.

FIG. 7A is a cross-sectional view showing a thin film bulk acoustic resonator according to a fifth embodiment of the present invention. In FIG. 7A, any portion which is similar or corresponds to a counterpart in the thin film bulk acoustic resonator as shown in FIGS. 3A and 3B is denoted by the same reference numeral as that used in FIGS. 3A and 3B, and the descriptions thereof are omitted.

As shown in FIG. 7A, an underlying electrode 23b is formed below a piezoelectric film portion 16a which constitutes at least a portion of the periphery of each of the first and second thin film bulk acoustic resonators 21 and 31 and which extends outwards therefrom. The underlying electrode 23b is connected to two lower electrodes 23, between which the underlying electrode 23b is interposed. The underlying electrode 23b is composed of a material having a lattice constant (lattice constant) which has a large difference from that of the two lower electrodes 23 comprised by the first and second thin film bulk acoustic resonators 21 and 31. More specifically, the material of the underlying electrode 23b and/or conditions for forming the underlying electrode 23b are prescribed so that a difference between the lattice constant of the piezoelectric film portions 16b and 16c comprised by the first and second thin film bulk acoustic resonators 21 and 31 and the lattice constant of the underlying electrode 23b (i.e., the lattice constant of a surface which comes in contact with the piezoelectric film portion 16a in the acoustic damping region) is greater than a difference between the lattice constant of the piezoelectric film portions 16b and 16c and the lattice constant of the lower electrodes 23 (i.e., the lattice constant of a surface which comes in contact with the piezoelectric film portion 16a in regions other than the acoustic damping region). Moreover, the piezoelectric film is also formed above the underlying electrode 23b, which is not lattice-matched. As a result, lattice matching is attained by the piezoelectric film portions 16b and 16c and the lower electrode 23, whereas lattice mismatching exists between the piezoelectric film portion 16a and the underlying electrode 23b. Consequently, the piezoelectric film portion 16a has a lower crystallinity than that of the piezoelectric film portions 16b and 16c.

Thus, the piezoelectric film portion 16a constitutes the acoustic damping region 50. Consequently, the acoustic waves propagating through the piezoelectric film 16 along the lateral direction are damped upon entry into the acoustic damping region 50. As a result, the lateral propagation modes can be selectively damped, thus minimizing the influence on each of the adjoining thin film bulk acoustic resonators.

The fifth embodiment above illustrates an example where the material of the underlying electrode is selected so as to have a different lattice constant. Alternatively, in the case where AlN (which is a hexagonal material) is employed as a piezoelectric film, differences in orientation within the underlying electrode maybe utilized to form the acoustic damping region. For example, the (111) plane and the (001) plane of platinum (Pt) may be utilized to introduce a different lattice constant at the surface which comes in contact with the piezoelectric film. In this case, an AlN film grows with good matching on the Pt(111) plane, but has poorer crystallinity on the Pt(001) plane. Therefore, by ensuring that the lower electrode 23 has the Pt(111) plane and that the underlying electrode 23b has the Pt(001) plane, the acoustic damping region can be formed. Thus, similar effects to those described above can be attained by creating the acoustic damping region by adjusting the orientation within the underlying electrode in such a manner. In other words, it is unnecessary to employ respectively different materials for the lower electrode 23 and the underlying electrode 23b.

(First Variant of the Fifth Embodiment)

Figure 7B:
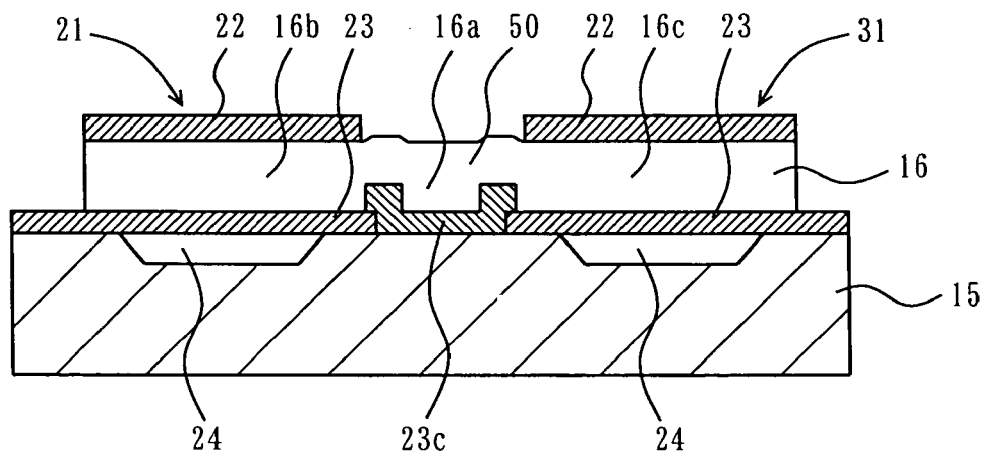
FIG. 7B is a cross-sectional view showing a first variant of the thin film bulk acoustic resonator according to the fifth embodiment of the present invention.

FIG. 7B is a cross-sectional view showing a first variant of the thin film bulk acoustic resonator according to the fifth embodiment of the present invention. As shown in FIG. 7B, each end of an underlying electrode 23c, which is interposed between two lower electrodes 23, rides over an end of one of the lower electrodes 23. It is also ensured that the lower electrodes 23 have a lattice constant which is quite different from that of the underlying electrode 23c. By adopting such a structure, too, an acoustic damping region can be formed at a piezoelectric film portion 16a when a piezoelectric film 16 is deposited.

(Second Variant of the Fifth Embodiment)

Figure 7C:
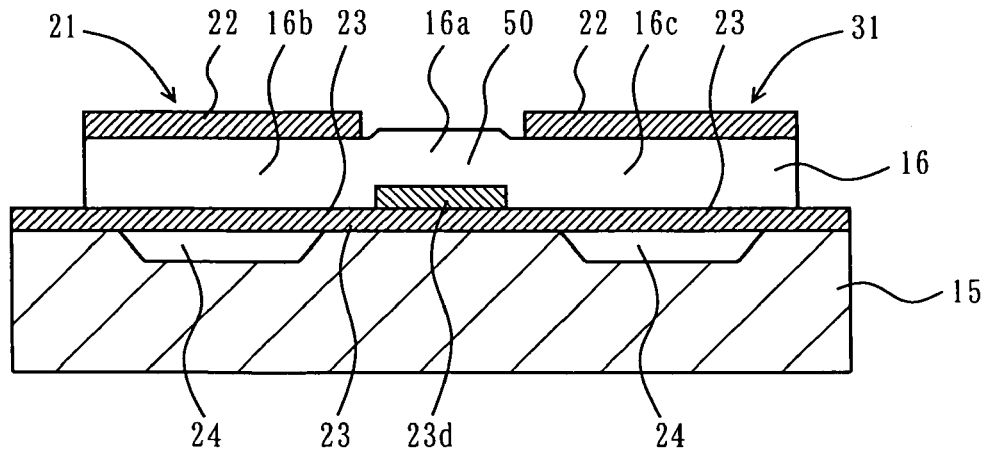
FIG. 7C is a cross-sectional view showing a second variant of the thin film bulk acoustic resonator according to the fifth embodiment of the present invention variant.

FIG. 7C is a cross-sectional view showing a second variant of the thin film bulk acoustic resonator according to the fifth embodiment of the present invention variant. As shown in FIG. 7C, one lower electrode 23 is continuously formed without being split between the first and second thin film bulk acoustic resonators 21 and 31. An underlying electrode 23d is formed upon the lower electrode 23, so as to be positioned below a piezoelectric film portion 16a which constitutes at least a portion of the periphery of each of the first and second thin film bulk acoustic resonators 21 and 31 and which extends outwards therefrom. It is also ensured that the lower electrode 23 has a lattice constant which is quite different from that of the underlying electrode 23d. By adopting such a structure, too, an acoustic damping region can be formed at a piezoelectric film portion 16a when a piezoelectric film 16 is deposited.

(Third Variant of the Fifth Embodiment)

Figure 7D:
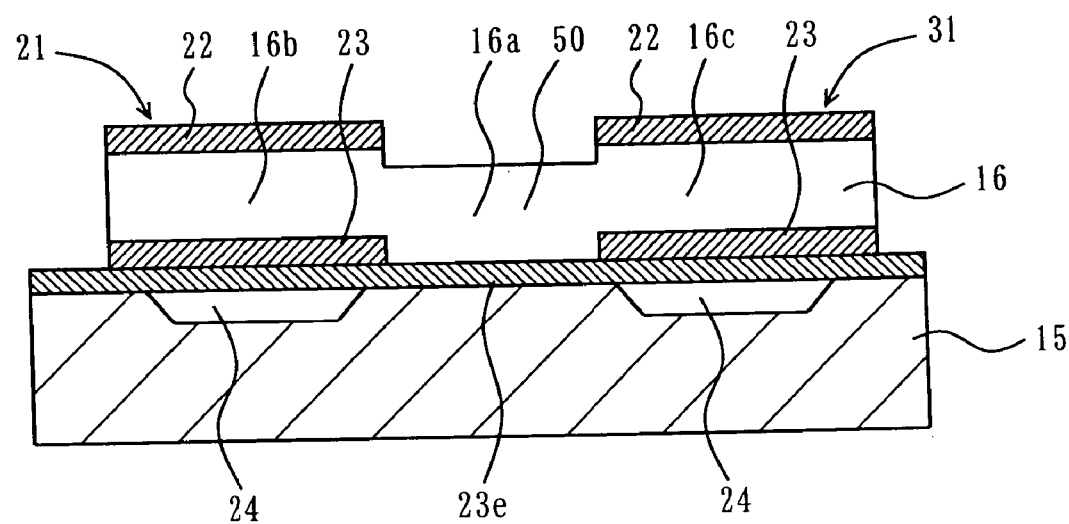
FIG. 7D is a cross-sectional view showing a third variant of the thin film bulk acoustic resonator according to the fifth embodiment of the present invention.

FIG. 7D is a cross-sectional view showing a third variant of the thin film bulk acoustic resonator according to the fifth embodiment of the present invention. As shown in FIG. 7D, an underlying electrode 23e is formed on a substrate 15. A lower electrode 23 of a first thin film bulk acoustic resonator 21 and a lower electrode 23 of a second thin film bulk acoustic resonator 31 are provided upon the underlying electrode 23e, so as to be apart from each other. It is also ensured that the lower electrode 23 has a lattice constant which is quite different from that of the underlying electrode 23e. By adopting such a structure, too, an acoustic damping region can be formed at a piezoelectric film portion 16a when a piezoelectric film 16 is deposited.

(Sixth Embodiment)

Figure 8A:
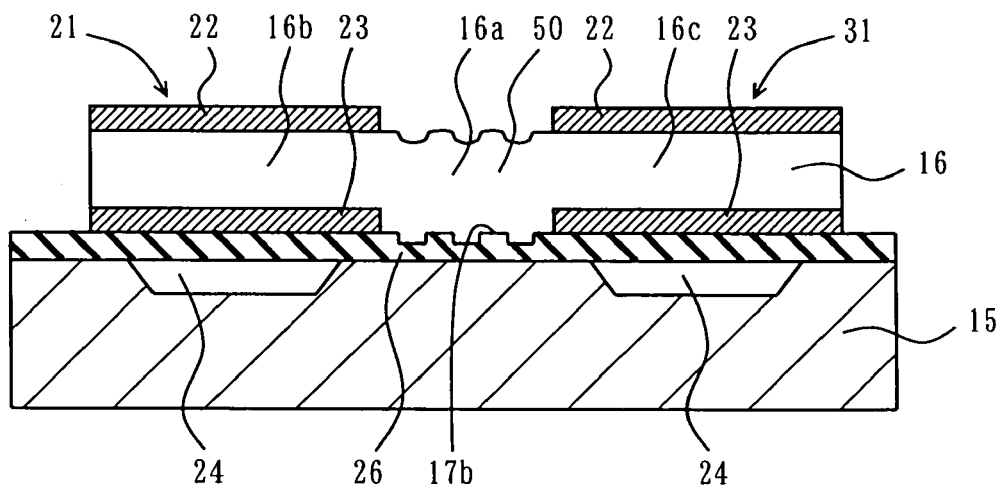
FIG. 8A is a cross-sectional view showing a thin film bulk acoustic resonator according to a sixth embodiment of the present invention.

FIG. 8A is a cross-sectional view showing a thin film bulk acoustic resonator according to a sixth embodiment of the present invention. In FIG. 8A, any portion which is similar or corresponds to a counterpart in the thin film bulk acoustic resonator as shown in FIGS. 3A and 3B is denoted by the same reference numeral as that used in FIGS. 3A and 3B, and the descriptions thereof are omitted.

In FIG. 8A, the thin film bulk acoustic resonator additionally comprises a dielectric layer 26 between a substrate 15 and a piezoelectric film 16. In the case where the substrate 15 is a semiconductive silicon substrate, for example, the dielectric layer 26 serves as an insulating layer for insulating the substrate 15 from lower electrodes 23. As a material of the insulating film, silicon oxide ($SiO_2$) or silicon nitride ($Si_3N_4$) may be used, for example. Alternatively, a piezoelectric film of aluminum nitride (AlN) or the like may be used as the insulating film. A stepped portion 17b is provided on the surface of the dielectric layer 26 so as to be positioned below a piezoelectric film portion 16a which constitutes at least a portion of the periphery of each of the first and second thin film bulk acoustic resonators 21 and 31 and which extends outwards therefrom.

When the piezoelectric film 16 is deposited, the piezoelectric film portion 16a is affected by the stepped portion 17b so as to partially lose its lattice regularity. On the other hand, piezoelectric film portions 16b and 16c comprised by the first and second thin film bulk acoustic resonators 21 and 31, respectively, are formed so as to conserve the lattice regularity in the lower electrodes 23. As a result, the piezoelectric film portion 16a has a substantially lower crystallinity than that of the other piezoelectric film portions 16b and 16c, thus defining an acoustic damping region 50. The acoustic waves propagating through the piezoelectric film 16 along the lateral direction are damped upon entry into the acoustic damping region 50. As a result, the lateral propagation modes can be selectively damped, thus minimizing the influence on each of the adjoining thin film bulk acoustic resonators.

(A Variant of the Sixth Embodiment)

Figure 8B:
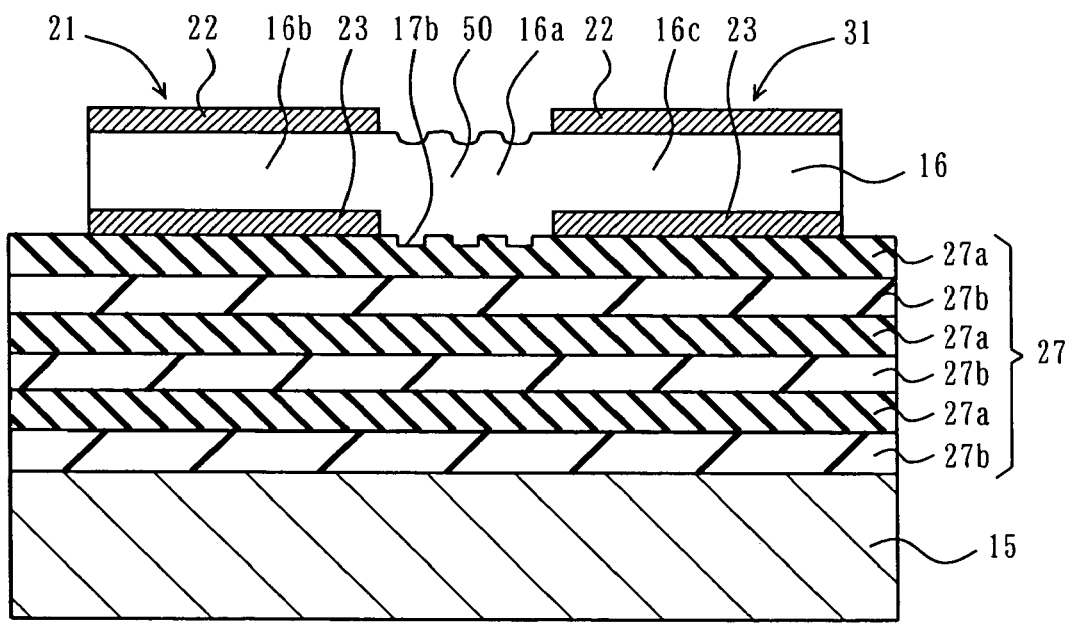
FIG. 8B is a cross-sectional view showing a variant of the thin film bulk acoustic resonator according to the sixth embodiment of the present invention.

FIG. 8B is a cross-sectional view showing a variant of the thin film bulk acoustic resonator according to the sixth embodiment of the present invention. As shown in FIG. 8B, an acoustic mirror 27, having an alternating structure of low acoustic impedance layers 27a and high acoustic impedance layers 27b, is provided on a substrate 15. The acoustic mirror 27, which has the same function as that of the cavities described in the second to fifth embodiments, contains the resonant vibration of each resonator so as to remain within the resonator. Upon the acoustic mirror 27, a first thin film bulk acoustic resonator 21 and a second thin film bulk acoustic resonator 31 are provided so as to be apart from each other. A stepped portion 17b is provided on the surface of the uppermost layer in the acoustic mirror 27, so as to be positioned below a piezoelectric film portion 16a which constitutes at least a portion of the periphery of each of the first and second thin film bulk acoustic resonators 21 and 31 and which extends outwards therefrom.

In the structure as shown in FIG. 8B, too, when the piezoelectric film 16 is deposited, the piezoelectric film portion 16a formed above the stepped portion 17b is affected by the stepped portion 17b so as to partially lose its lattice regularity. On the other hand, the piezoelectric film portions 16b and 16c are formed so as to conserve the lattice regularity in the lower electrodes 23. As a result, the piezoelectric film portion 16a has a lower crystallinity than that of the other piezoelectric film portions 16b and 16c respectively comprised by the thin film bulk acoustic resonators 21 and 31, and thus defines the acoustic damping region 50.

In the sixth embodiment and its variant, two adjoining thin film bulk acoustic resonators are provided on a dielectric layer or an acoustic mirror layer. Alternatively, a single thin film bulk acoustic resonator may be provided on a dielectric layer or an acoustic mirror layer, whereby similar effects to those described above can be attained. Furthermore, similar effects can also be obtained for a device in which two or more thin film bulk acoustic resonators are integrated on a dielectric layer or an acoustic mirror layer (e.g., a filter), by ensuring that each thin film bulk acoustic resonator includes an acoustic damping region.

Although the sixth embodiment and its variant each illustrate an example where a rectangular-shaped stepped portion 17b is formed, the shape of the stepped portion is not limited thereto. The stepped portion may be tapered (obtained by forming a slanted portion on the substrate) (not shown), or have a gently undulated shape (not shown), to obtain similar effects. The stepped portion does not need to contain a series of steps, but may contain a single step dividing between a higher level and a lower level. For example, a difference may be provided between the level of a region of the substrate 15 in which the first thin film bulk acoustic resonator 21 is disposed and the level of a region of the substrate 15 in which the second thin film bulk acoustic resonator 31 is disposed, and this level difference may be used as a stepped portion between the first and second thin film bulk acoustic resonators 21 and 31 to define an acoustic damping region.

In the case where two thin film bulk acoustic resonators are disposed so as to adjoin each other, more outstanding effects can be obtained if the resonators have respectively different resonance frequencies, or if the resonators are disposed so that laterally-propagating sound wave modes propagating therethrough have the same phase. The reason is that, while two acoustic waves having the same frequency and opposite phases (180° apart) can be expected to cancel each other, any two acoustic waves not satisfying such a relationship are likely to strengthen each other, thus giving all the more reason for requiring an acoustic damping region between the resonators to prevent or suppress the problem.

Although FIGS. 8A and 8B illustrate examples where the dielectric layer or the acoustic mirror layer is continuously formed along the lateral direction, with a stepped portion being formed between the first and second thin film bulk acoustic resonators 21 and 31, the dielectric layer or the acoustic mirror layer does not need to be continuous along the lateral direction. In the case where the dielectric layer or the acoustic mirror layer is not continuous along the lateral direction, a piece of dielectric material may be patterned into a stepped portion in a region where the stepped portion is to be formed, for example. Alternatively, in the case where the dielectric layer or the acoustic mirror layer is continuous along the lateral direction, after the formation of the dielectric layer or acoustic mirror layer, a further patterning may be performed using the same dielectric material or the like to obtain a stepped portion.

(Seventh Embodiment)

Figure 9A:
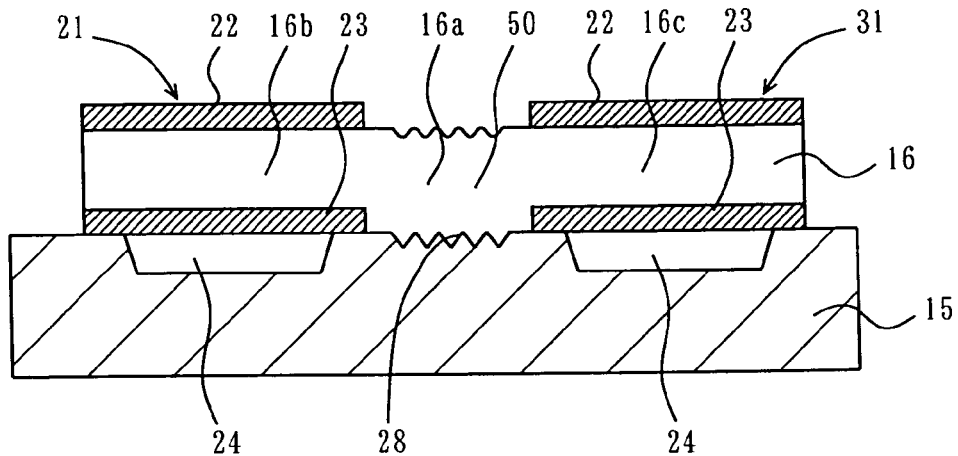
FIG. 9A is a cross-sectional view showing a thin film bulk acoustic resonator according to a seventh embodiment of the present invention embodiment.

FIG. 9A is a cross-sectional view showing a thin film bulk acoustic resonator according to a seventh embodiment of the present invention. In FIG. 9A, any portion which is similar or corresponds to a counterpart in the thin film bulk acoustic resonator as shown in FIGS. 3A and 3B is denoted by the same reference numeral as that used in FIGS. 3A and 3B, and the descriptions thereof are omitted.

As shown in FIG. 9A, a portion 28 on the surface of the substrate 15, located below a piezoelectric film portion 16a which constitutes at least a portion of the periphery of each of the first and second thin film bulk acoustic resonators 21 and 31 and which extends outwards therefrom, is roughened so as to have irregular bumps and dents. As a result, any element which comes in contact with the piezoelectric film portion 16a will have a coarser surface than the surface of an element which is in contact with the first and second thin film bulk acoustic resonators 21 and 31. The roughening process may be performed by dry etching, for example. Alternatively, the roughening process may be performed by a mechanical processing method such as sand blast technique.

When the piezoelectric film 16 is deposited, the piezoelectric film portion 16a formed above the roughened portion 28 is affected by the irregular bumps and dents in the roughened portion 28, so that the lattice regularity of the piezoelectric film portion 16a is greatly reduced. On the other hand, piezoelectric film portions 16b and 16c comprised by the first and second thin film bulk acoustic resonators 21 and 31, respectively, are formed so as to conserve the lattice regularity in the lower electrodes 23. As a result, the piezoelectric film portion 16a has a lower crystallinity than that of the other piezoelectric film portions 16b and 16c, thus defining an acoustic damping region 50. The acoustic waves propagating through the piezoelectric film 16 along the lateral direction are damped upon entry into the acoustic damping region 50. As a result, the lateral propagation modes can be selectively damped, thus minimizing the influence on each of the adjoining thin film bulk acoustic resonators.

(First Variant of the Seventh Embodiment)

Figure 9B:
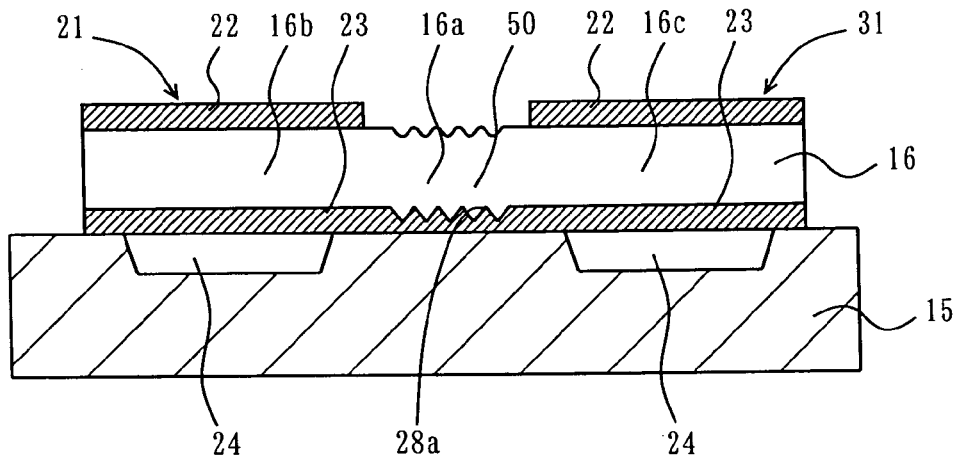
FIG. 9B is a cross-sectional view showing a first variant of the thin film bulk acoustic resonator according to the seventh embodiment of the present invention.

FIG. 9B is a cross-sectional view showing a first variant of the thin film bulk acoustic resonator according to the seventh embodiment of the present invention. As shown in FIG. 9B, a lower electrode 23 is formed as a continuous electrode layer, without being split between the first and second thin film bulk acoustic resonators 21 and 31. A portion 28a which is on the surface of this electrode layer and which is located below a region where an acoustic damping region 50 is to be formed is roughened. In such a structure, too, when a piezoelectric film 16 is deposited, a piezoelectric film portion 16a will have a lower crystallinity than that of piezoelectric film portions 16b and 16c comprised by the first and second thin film bulk acoustic resonators 21 and 31, and thus defines an acoustic damping region 50.

(Second Variant of the Seventh Embodiment)

Figure 9C:
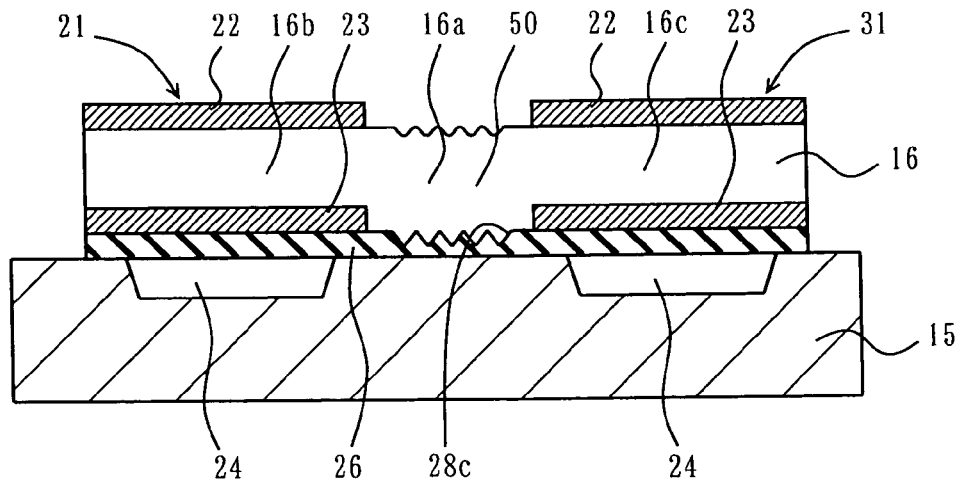
FIG. 9C is a cross-sectional view showing a second variant of the thin film bulk acoustic resonator according to the seventh embodiment of the present invention.

FIG. 9C is a cross-sectional view showing a second variant of the thin film bulk acoustic resonator according to the seventh embodiment of the present invention. As shown in FIG. 9C, a dielectric layer 26 is provided on a substrate 15. On the dielectric layer 26, first and second thin film bulk acoustic resonators 21 and 31 are formed so as to be apart from each other. In the case where the substrate 15 is a silicon substrate, for example, the dielectric layer 26 serves as an insulating layer for insulating the substrate 15 from lower electrodes 23. A portion 28c which is on the surface of the dielectric layer 26 and which is located below a region where an acoustic damping region 50 is to be formed is roughened. In such a structure, too, when a piezoelectric film 16 is deposited, a piezoelectric film portion 16a will have a lower crystallinity than that of piezoelectric film portions 16b and 16c comprised by the first and second thin film bulk acoustic resonators 21 and 31, and thus defines an acoustic damping region 50.

Although the seventh embodiment and its variants each illustrate an example where either the substrate 15, the lower electrode 23, or the dielectric layer 26 is roughened, the present invention is not limited thereto. As long as a roughening process is performed for the surface of an element which is in contact with the piezoelectric film portion 16a defining the acoustic damping region 50, the piezoelectric film portion 16a is affected by the configuration of the roughened portion at the time of deposition, so that the lattice regularity of the deposited piezoelectric film portion 16a is reduced. As a result, the piezoelectric film portion 16a has a lower crystallinity, and thus constitutes an acoustic damping region.

(Producing Method for the Seventh Embodiment)

FIGS. 10A, 10B, 10C, 10D, 10E, 10F, and 10G are cross-sectional views illustrating a method for producing the thin film bulk acoustic resonator according to the seventh embodiment of the present invention. Hereinafter, with reference to FIGS. 10A to 10G, a method for producing the thin film bulk acoustic resonator according to the seventh embodiment will be described.

Figure 10A:
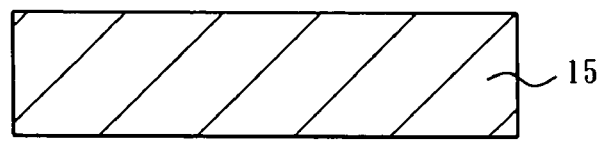
FIGS. 10A, 10B, 10C, 10D, 10E, 10F, and 10G are cross-sectional views illustrating a method for producing the thin film bulk acoustic resonator according to the seventh embodiment of the present invention.

First, as shown in FIG. 10A, a substrate 15 is prepared.

Figure 10B:
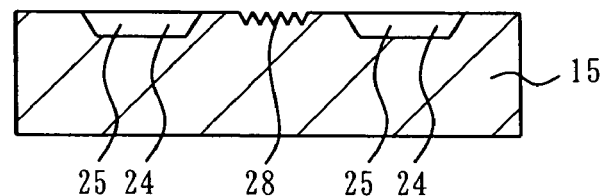

Next, as shown in FIG. 10B, a roughening process (e.g., dry etching) is performed for a portion 28 which is on the surface of the substrate 15 and which is located below a region where an acoustic damping region 50 is to be formed, thus forming irregular bumps and dents. In addition, two cavities 24 are formed in regions where thin film bulk acoustic resonators are to be formed.

Figure 10C:
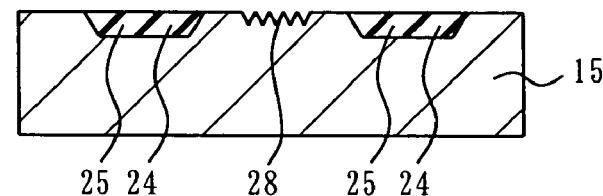

Next, as shown in FIG. 10C, a sacrificial layer 25, which can be removed later, is embedded in each of the two cavities 24.

Figure 10D:
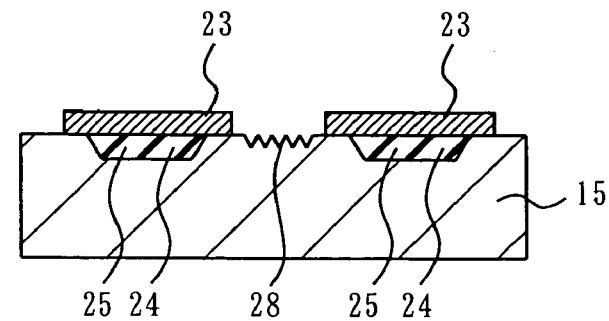

Next, as shown in FIG. 10D, two lower electrodes 23 are formed so as to lie across the respective cavities 24.

Figure 10E:
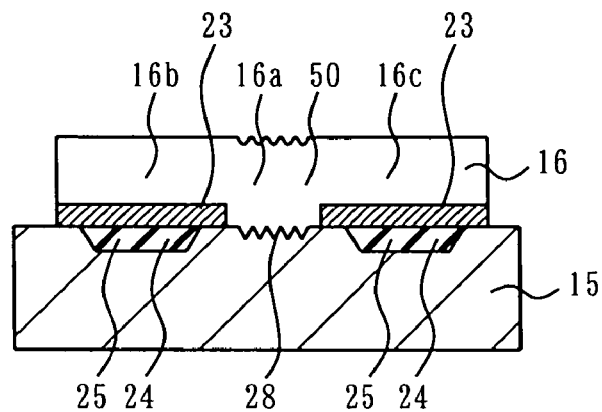

Next, as shown in FIG. 10E, a common piezoelectric film 16 is deposited on the substrate 15 so as to cover the lower electrodes 23. When the piezoelectric film 16 is deposited, the piezoelectric film portion 16a formed above the roughened portion 28 is affected by the irregular bumps and dents in the roughened portion 28 so as to partially lose its lattice regularity. On the other hand, the piezoelectric film portions 16b and 16c are formed so as to conserve the lattice regularity in the two lower electrodes 23. As a result, the piezoelectric film portion 16a has a lower crystallinity than that of the piezoelectric film portions 16b and 16c, which are respectively comprised by the thin film bulk acoustic resonators 21 and 31. Thus, the acoustic damping region 50 is formed.

Figure 10F:
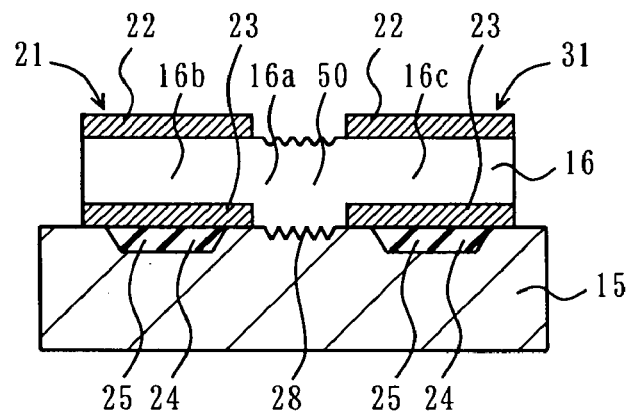

Next, as shown in FIG. 10F, on the common piezoelectric film 16, an upper electrode 22 for the first thin film bulk acoustic resonator 21 and an upper electrode 22 for the second thin film bulk acoustic resonator 31 are formed so as to be apart from each other.

Figure 10G:
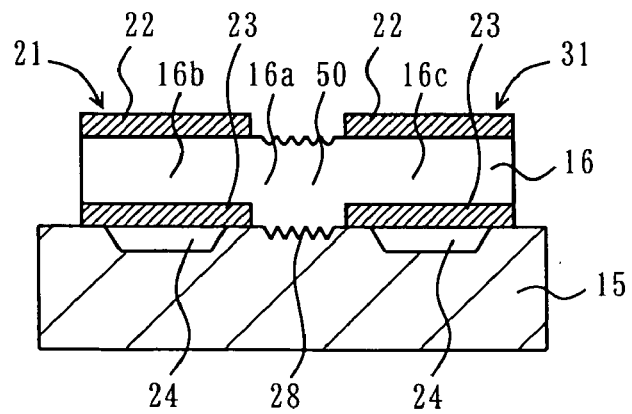

Next, as shown in FIG. 10G, the sacrificial layer 25 in each cavity 24 is removed.

According to the present producing method, the acoustic damping region 50 can be formed by a simple production process of performing a roughening process for the surface of the substrate 15.

(Eighth Embodiment)

Figure 11A:
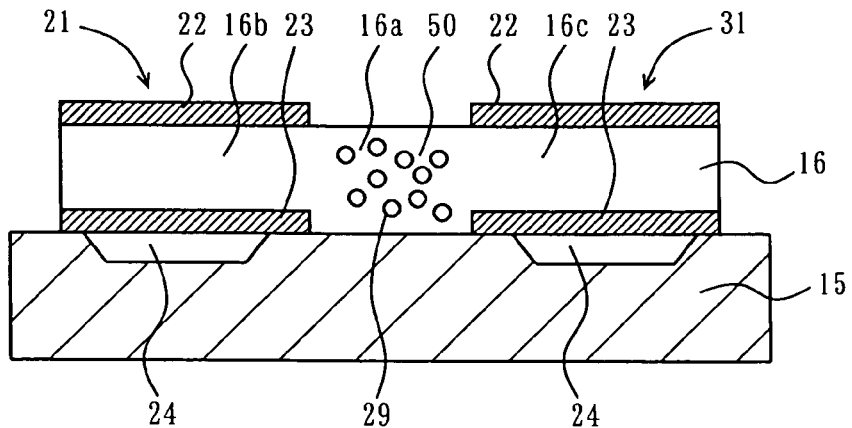
FIG. 11A is a cross-sectional view showing a thin film bulk acoustic resonator according to an eighth embodiment of the present invention.

FIG. 11A is a cross-sectional view showing a thin film bulk acoustic resonator according to an eighth embodiment of the present invention. In FIG. 11A, any portion which is similar or corresponds to a counterpart in the thin film bulk acoustic resonator as shown in FIGS. 3A and 3B is denoted by the same reference numeral as that used in FIGS. 3A and 3B, and the descriptions thereof are omitted.

As shown in FIG. 11A, by thermal diffusion, heterogenous atoms 29 such as Ti or Zr are introduced into a piezoelectric film portion 16a, which is a portion of a piezoelectric film 16 at which an acoustic damping region 50 is to be formed. As used herein, "heterogenous atoms" refer to atoms which are different from any of the elements composing the piezoelectric film. The thermal diffusion of the heterogenous atoms 29 is performed by disposing a metal layer (e.g., Ti or Zr) above or under the piezoelectric film portion 16a, and applying heat thereto. Through the thermal diffusion of the heterogenous atoms 29, the piezoelectric film portion 16a partially loses its lattice regularity. On the other hand, the crystallinity of lower electrodes 23 is conserved in piezoelectric film portions 16b and 16c. As a result, the piezoelectric film portion 16a has a lower crystallinity than that of the piezoelectric film portions 16b and 16c, which are respectively comprised by first and second thin film bulk acoustic resonators 21 and 31, and thus defines an acoustic damping region 50 which provides substantial damping for the unwanted vibration modes.

The acoustic waves propagating through the piezoelectric film 16 along the lateral direction are damped upon entry into the acoustic damping region 50. As a result, the lateral propagation modes can be selectively damped, thus minimizing the influence on each of the adjoining thin film bulk acoustic resonators.

By introducing heterogenous atoms at arbitrary positions, an acoustically discontinuous portion can be formed which has a random shape with respect to directions in the plane of the surface of the resonators or the thickness direction, thus making it possible to diffuse the unwanted vibration modes. As a result, the lateral propagation modes can be selectively damped.

In the case where AlN is used as the piezoelectric film, the acoustic damping region maybe formed through thermal diffusion of homogenous atoms, such as Al. As used herein, "homogenous atoms" refer to any of the elements composing the piezoelectric film. Thus, the acoustic damping region is formed in response to a change in the original stoichiometric ratio of the piezoelectric film caused by the thermal diffusion of atoms from the exterior.

(First Variant of the Eighth Embodiment)

Figure 11B:
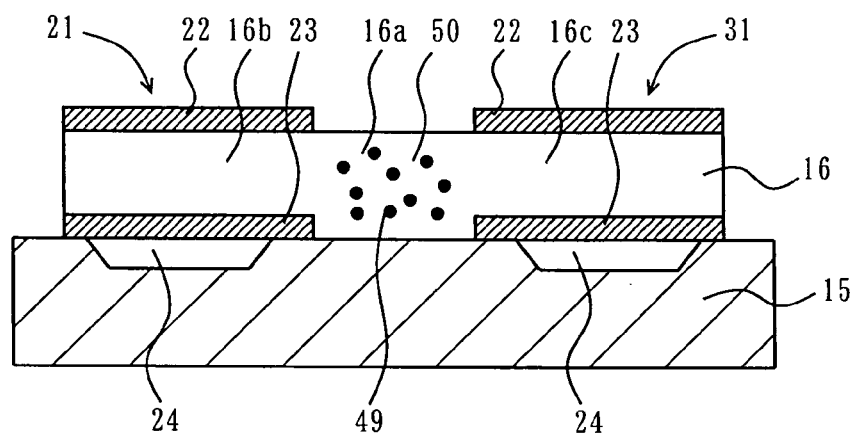
FIG. 11B is a cross-sectional view showing a first variant of the thin film bulk acoustic resonator according to the eighth embodiment of the present invention.

FIG. 11B is a cross-sectional view showing a first variant of the thin film bulk acoustic resonator according to the eighth embodiment of the present invention. As shown in FIG. 11B, heterogenous ions 49 of C,N,B,O, or metal ions are implanted to a piezoelectric film portion 16a, which is a portion of a piezoelectric film 16 at which an acoustic damping region 50 is to be formed. As used herein, "heterogenous ions" refer to ions of elements which are different from any of those composing the piezoelectric film. The implantation of the heterogenous ions 49 is performed by accelerating ionized particles so as to allow the particles to be bombarded against the surface of the piezoelectric film portion 16a. Due to the implantation of the heterogenous ions 49, the piezoelectric film portion 16a partially loses its lattice regularity. On the other hand, the piezoelectric film portions 16b and 16c retain good crystallinity. As a result, the piezoelectric film portion 16a has a lower crystallinity than that of the piezoelectric film portions 16b and 16c, which are respectively comprised by first and second thin film bulk acoustic resonators 21 and 31, and thus defines an acoustic damping region 50.

By introducing heterogenous atoms at arbitrary positions, an acoustically discontinuous portion can be formed which has a random shape with respect to directions in the plane of the surface of the resonators or the thickness direction, thus making it possible to diffuse the unwanted vibration modes. As a result, the lateral propagation modes can be selectively damped.

In the case where AlN is used as the piezoelectric film, the acoustic damping region may be formed through implantation of homogenous ions, such as Al or N. As used herein, "homogenous ions" refer to ions of any of the elements composing the piezoelectric film, e.g., Al or N. Thus, the acoustic damping region is formed in response to a change in the original stoichiometric ratio of the piezoelectric film caused by the implantation of additional ions to the piezoelectric film.

(Second Variant of the Eighth Embodiment)

Figure 11C:
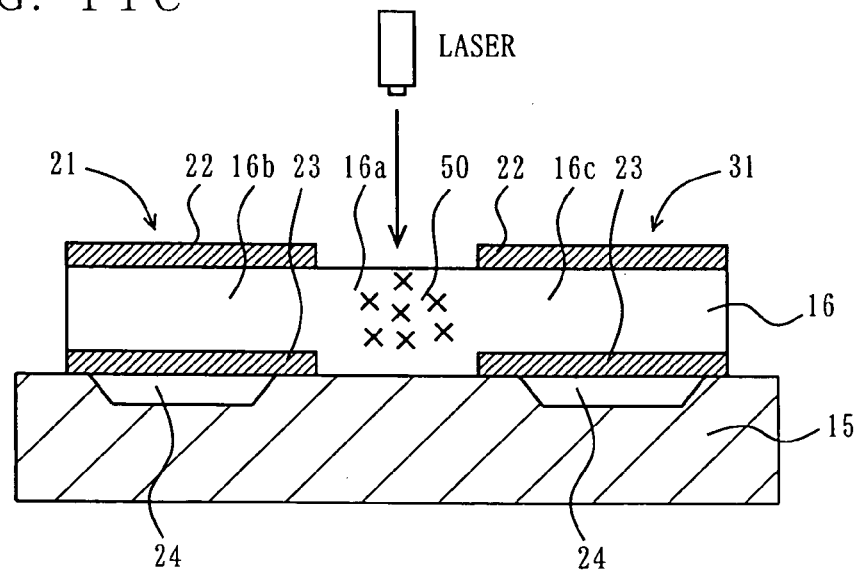
FIG. 11C is a cross-sectional view showing a second variant of the thin film bulk acoustic resonator according to the eighth embodiment of the present invention variant.

FIG. 11C is a cross-sectional view showing a second variant of the thin film bulk acoustic resonator according to the eighth embodiment of the present invention variant. As shown in FIG. 11C, by irradiating a laser beam on the surface of the piezoelectric film 16 while using upper electrodes 22 as masks, an acoustic damping region 50 is formed. Alternatively, a laser beam may be selectively irradiated on a portion in which an acoustic damping region is to be formed, thus forming the acoustic damping region. As a result, the piezoelectric film portion 16a partially loses its lattice regularity. In FIG. 11C, the X marks exemplify positions at which lattice regularity is lost. On the other hand, the piezoelectric film portions 16b and 16c which are respectively comprised by the first and second thin film bulk acoustic resonators 21 and 31 retain good crystallinity, free from the influence of the laser irradiation. As a result, the piezoelectric film portion 16a has a lower crystallinity than that of the other piezoelectric film portions 16b and 16c, which are respectively comprised by first and second thin film bulk acoustic resonators 21 and 31, and thus defines an acoustic damping region 50.

Although the second to eighth embodiments each illustrate an example where the first and second thin film bulk acoustic resonators 21 and 31 are provided on the substrate 15, it will be appreciated that it is not necessary for the first and second thin film bulk acoustic resonators 21 and 31 to be provided on a substrate.

The second to eighth embodiments each illustrate an example where the cavities 24 are provided as recesses in the surface of the substrate 15. However, it is not necessary to recess the surface of the substrate as long as cavities are somehow obtained.

Figure 12A:
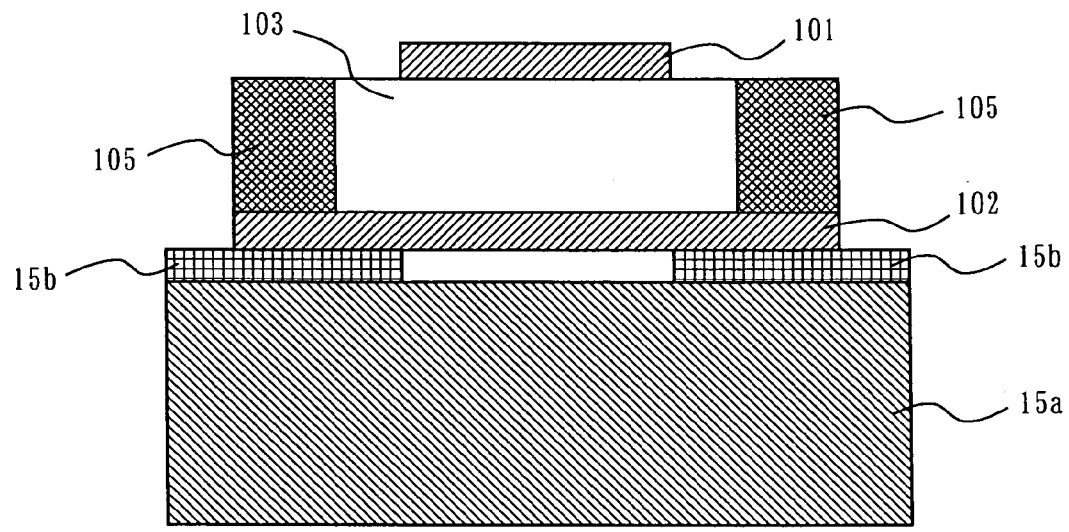
FIG. 12A is a diagram illustrating a cross-sectional structure in the case where a thin film bulk acoustic resonator is formed on a support 15b which is provided on a substrate 15a, the support 15b having an aperture therein.

FIG. 12A is a diagram illustrating a cross-sectional structure in the case where a thin film bulk acoustic resonator is formed on a support 15b which is provided on a substrate 15a. The support 15b has an aperture therein. In the case where a semiconductor (e.g., silicon) is used for the substrate 15a, the support 15b is preferably an insulating film, or a multilayer film which at least includes an insulating film. In the case where the substrate 15a is composed of a nonconductor, the support 15b may be composed of a metal.

Figure 12B:
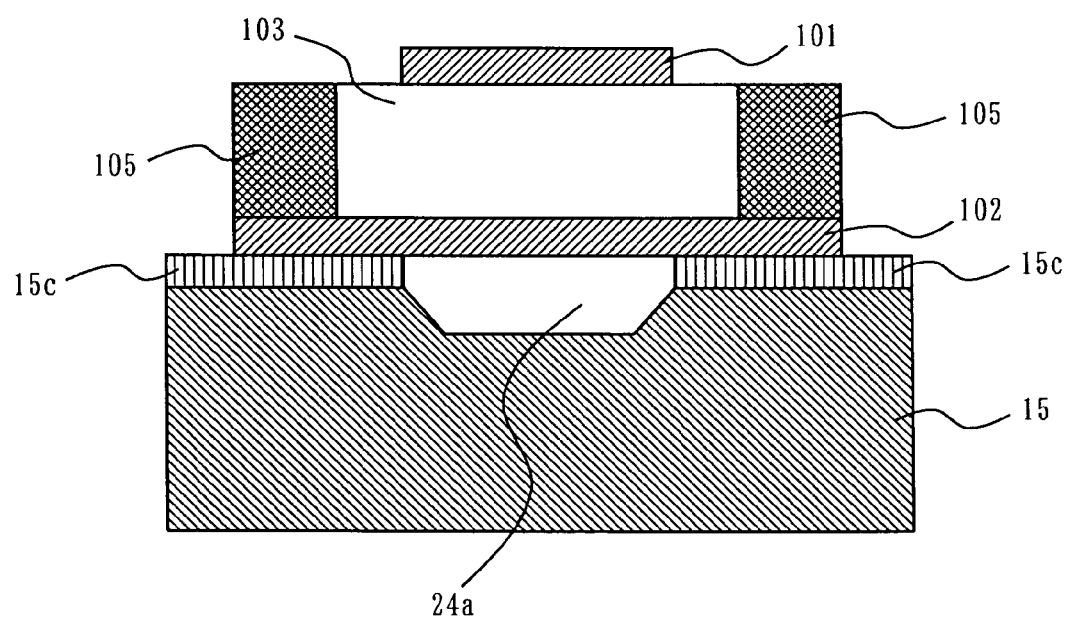

FIG. 12B is a diagram illustrating a cross-sectional structure in the case where an insulating film 15c is formed on a substrate 15 so as to exclude a cavity portion, such that the substrate 15 and the insulating film 15c together define a cavity 24a. As shown in FIG. 12B, a thin film bulk acoustic resonator may be provided on the substrate via the insulating film 15c.

Figure 12C:
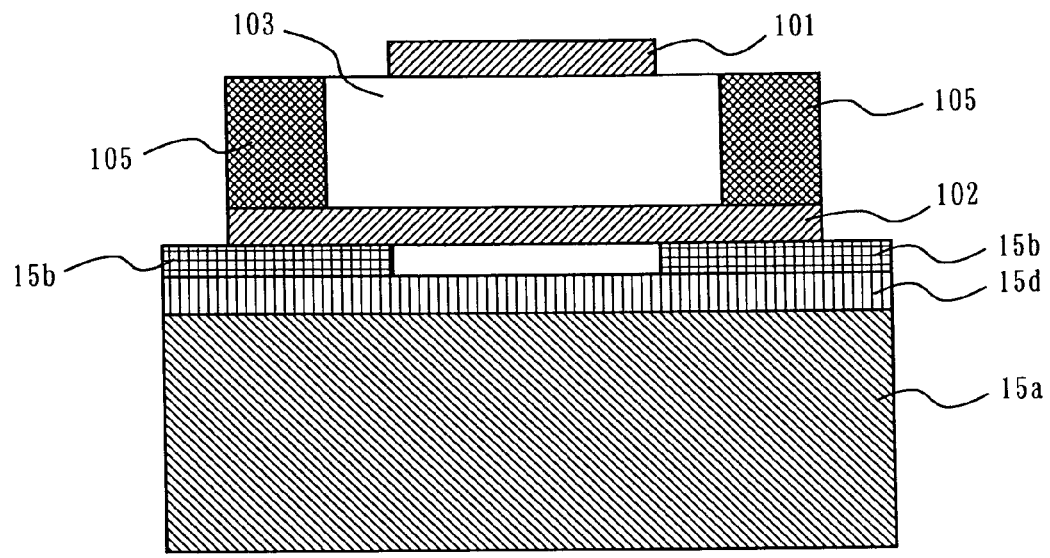

FIG. 12C is a diagram illustrating a cross-sectional structure in the case where a thin film bulk acoustic resonator is provided on a support 15b having an aperture therein, the support 15b being provided on an insulating film 15d which is formed on the entire surface of a substrate 15a. As shown in FIG. 12C, by forming the insulating film 15d on the entire surface of the substrate 15a, it becomes possible to utilize either a metal or an insulating film as the support 15b. Although FIGS. 12A to 12C each illustrate a single thin film bulk acoustic resonator, the same principle may also be applied in the case of constructing two or more thin film bulk acoustic resonators.

Figure 13:
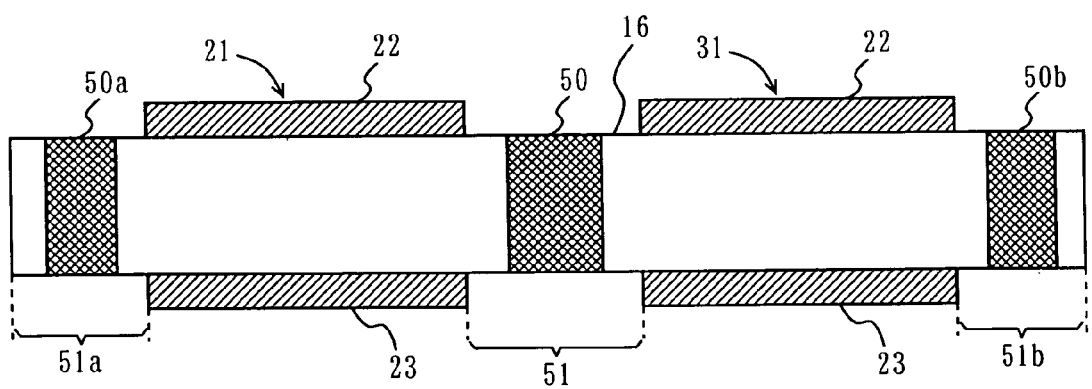
FIG. 13 is a cross-sectional view showing thin film bulk acoustic resonators, in the case where acoustic damping regions 50a and 50b are provided at ends of first and second thin film bulk acoustic resonators 21 and 31.

The second to eighth embodiments each illustrate an example where the acoustic damping region 50 is provided between the first and second thin film bulk acoustic resonators 21 and 31. Alternatively, acoustic damping regions may be provided at opposite ends of each of the first and second thin film bulk acoustic resonators 21 and 31. FIG. 13 is a cross-sectional view showing thin film bulk acoustic resonator, in the case where acoustic damping regions 50a and 50b are provided at ends of first and second thin film bulk acoustic resonators 21 and 31. As shown in FIG. 13, the acoustic damping region 50, 50a, and 50b may be formed in part of outer regions 51, 51a, and 51b, each of which extends outwards from the periphery of a resonator portion composed of a pair of electrodes and a piezoelectric film (a thin film bulk acoustic resonator).

(Ninth Embodiment)

Figure 14A:
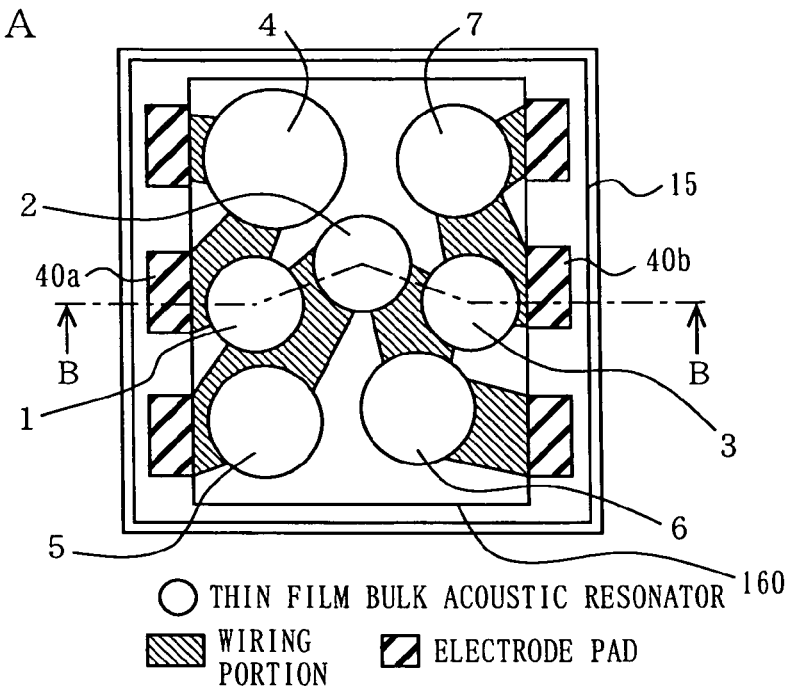
FIG. 14A is an upper plan view showing a thin film bulk acoustic resonator filter according to a ninth embodiment of the present invention.
Figure 14B:
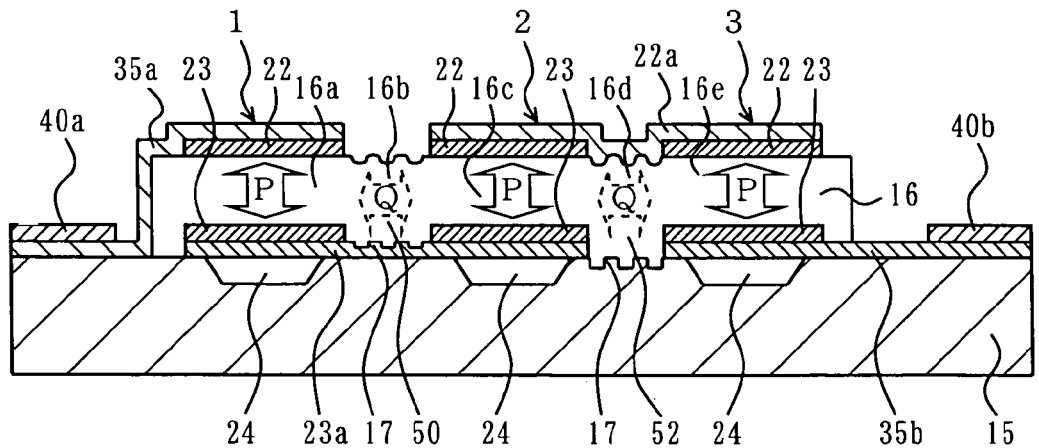
FIG. 14B is a cross-sectional view taken along line B—B in FIG. 14A.
Figure 14C:
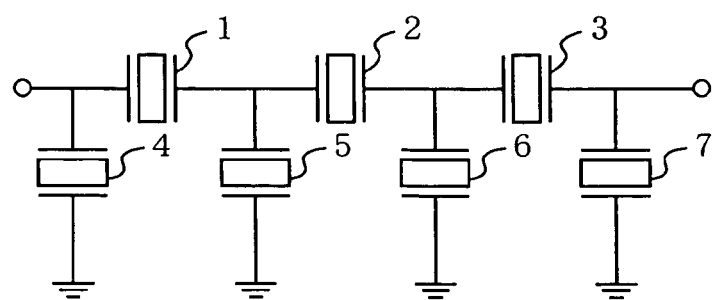
FIG. 14C is an equivalent circuit diagram of the thin film bulk acoustic resonator filter according to the ninth embodiment.

FIG. 14A is an upper plan view showing a thin film bulk acoustic resonator filter according to a ninth embodiment of the present invention. FIG. 14B is a cross-sectional view taken along line B—B in FIG. 14A. FIG. 14C is an equivalent circuit diagram of the thin film bulk acoustic resonator filter according to the ninth embodiment.

In FIGS. 14A to 14C, the thin film bulk acoustic resonator filter according to the ninth embodiment comprises thin film bulk acoustic resonators 1 to 7. Each of the thin film bulk acoustic resonators 1 to 7 is composed of an upper electrode, a lower electrode, and a common piezoelectric film 160 interposed between the upper electrode and the lower electrode. The thin film bulk acoustic resonators 1 to 7 shown in FIG. 14 are constructed so that, via wiring portions, the upper electrodes are interconnected to one another and the lower electrodes are interconnected to one another in a manner as shown in the equivalent circuit of FIG. 14C. The wiring portions which are connected to the thin film bulk acoustic resonators 1 to 7 are connected to electrode pads so as to realize terminal or ground connections as shown in the equivalent circuit of FIG. 14C. In order to suppress the influences of the lateral propagation modes on any adjoining thin film bulk acoustic resonator, the thin film bulk acoustic resonators 1 to 7 are constructed so that an acoustic damping region is formed in a portion of an outer region oriented toward each adjoining thin film bulk acoustic resonator.

For example, as shown in FIG. 14B, the thin film bulk acoustic resonators 1, 2, and 3 are in series connection by way of: an upper lead electrode 35a which is provided on the upper electrode 22 of the thin film bulk acoustic resonator 1; an underlying electrode 23a for interconnecting the lower electrodes 23 of the thin film bulk acoustic resonators 1 and 2; an upper connection electrode 22a for interconnecting the upper electrodes 22 of the thin film bulk acoustic resonators 2 and 3; and a lower lead electrode 35b which is connected to the lower electrode 23 of the thin film bulk acoustic resonator 3. The upper lead electrode 35a is connected to an electrode pad 40a. The lower lead electrode 35b is connected to an electrode pad 40b.

Between the thin film bulk acoustic resonator 1 and the thin film bulk acoustic resonator 2, an acoustic damping region 50 is provided. Between the thin film bulk acoustic resonator 2 and the thin film bulk acoustic resonator 3, an acoustic damping region 52 is provided. It is assumed that the acoustic damping region 50 is formed by providing a stepped portion 17 on the surface of the underlying electrode 23a in a manner as shown in FIG. 6. It is further assumed that the acoustic damping region 52 is formed by providing a stepped portion 17 on the substrate 15 and lowering the crystallinity of the piezoelectric film portion 16d which is provided thereupon in a manner as shown in FIG. 3A. It will be appreciated that the methods for producing the acoustic damping regions 50 and 52 are not limited thereto.

The acoustic waves propagating through the piezoelectric film 16 along the lateral direction Q are damped upon entry into the acoustic damping regions 50 and 52. As a result, without affecting the vertical vibration of the thin film bulk acoustic resonators 1, 2, and 3 along the thickness direction P, the lateral propagation modes can be selectively damped. Thus, the influence on each of the adjoining thin film bulk acoustic resonators can be minimized, and a thin film bulk acoustic resonator filter having excellent frequency characteristics can be obtained.

Hereinafter, preferable positioning of acoustic damping regions in a filter comprising a plurality of thin film bulk acoustic resonators will be discussed.

Figure 15:
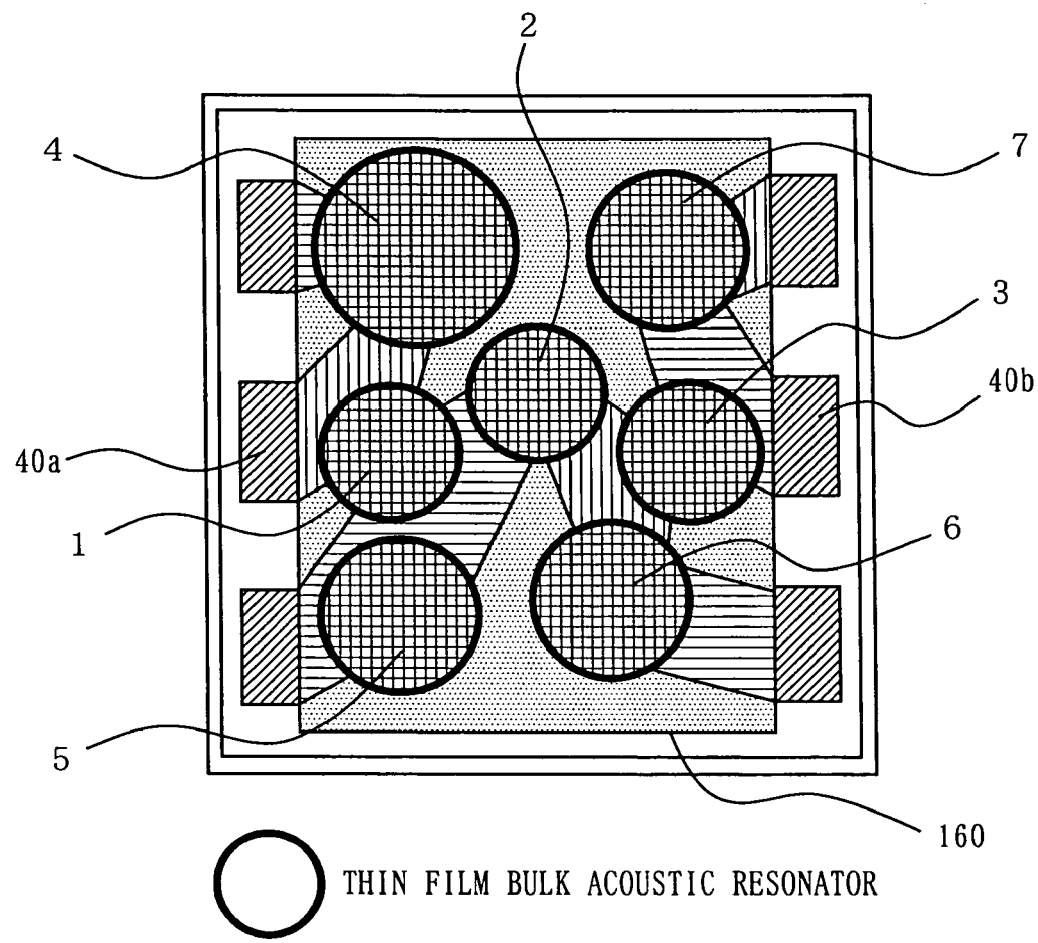
FIG. 15 is an upper plan view showing a thin film bulk acoustic resonator filter in which acoustic damping regions are deployed in a most preferable manner.
Figure 15:
Figure 15:
Figure 15:
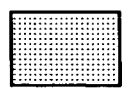
Figure 15:
Figure 15:
Figure 15:
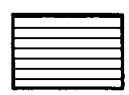

FIG. 15 is an upper plan view showing a thin film bulk acoustic resonator filter in which acoustic damping regions are deployed in a most preferable manner. In FIG. 15, the upper wiring portions (which are connected to the upper electrodes) and the lower wiring portions (which are connected to the lower electrodes) are shown with different hatching patterns to better illustrate that the thin film bulk acoustic resonator filter shown in FIG. 15 has the equivalent circuit shown in FIG. 14C. The piezoelectric film 160 is commonly provided between the upper electrodes and the lower electrodes of the thin film bulk acoustic resonators 1 to 7. In FIG. 15, the acoustic damping regions are shown with a hatching pattern which is distinct from the patterns used for any other portions, except that any acoustic damping region which overlaps with a lower wiring portion or an upper wiring portion is shown with a hatching pattern for the lower or upper wiring portion, instead of the distinct hatching pattern for the acoustic damping regions; however, it is to be understood that an acoustic damping region is provided in any such overlapping portion. Thus, it will be seen that the entire area of the piezoelectric film, except for each area interposed between an upper electrode and a lower electrode, constitutes an acoustic damping region. Thus, by ensuring that the entire area of the piezoelectric film constitutes an acoustic damping region except for each area interposed between an upper electrode and a lower electrode of a thin film bulk acoustic resonator, the lateral propagation modes can be damped to a maximum extent, and the influences on each of the adjoining thin film bulk acoustic resonators can be minimized. As a result, a thin film bulk acoustic resonator filter having excellent frequency characteristics is provided.

Figure 16:
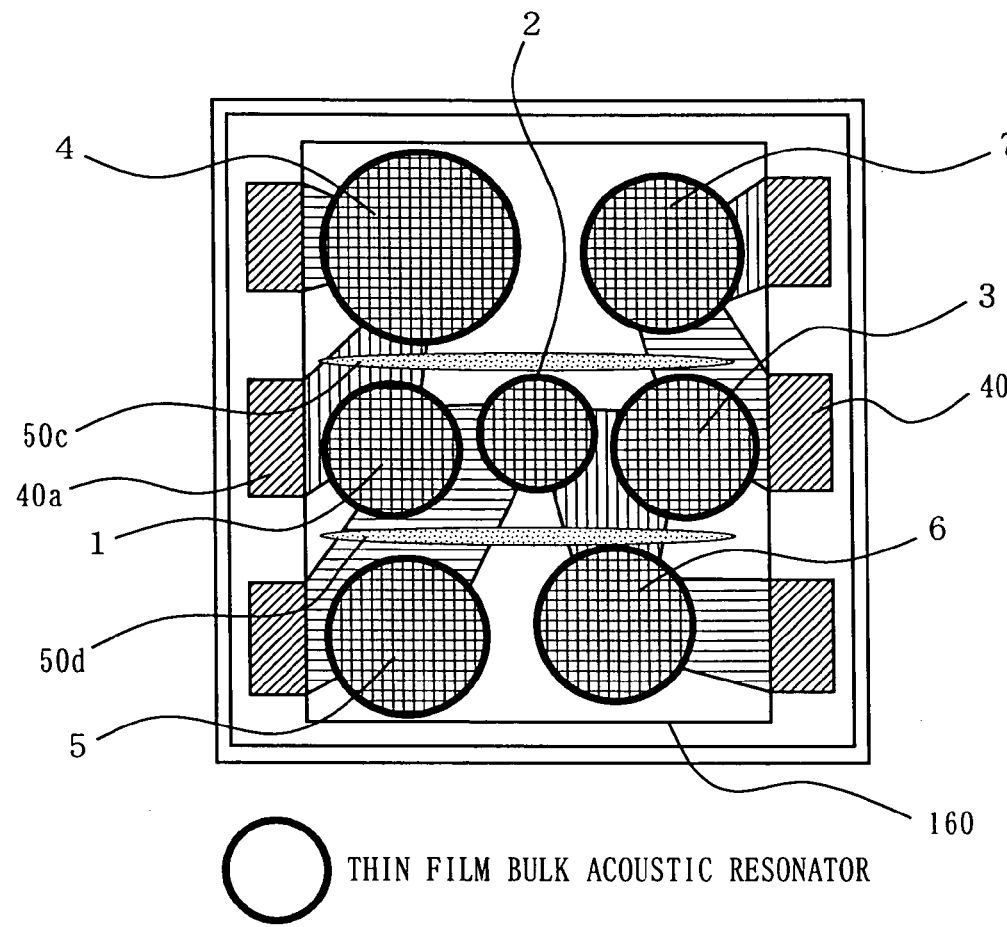
FIG. 16 is an upper plan view showing a thin film bulk acoustic resonator filter in the case where minimum acoustic damping regions for obtaining a thin film bulk acoustic resonator filter having excellent frequency characteristics are provided.
Figure 16:
Figure 16:
Figure 16:
Figure 16:
Figure 16:

FIG. 16 is an upper plan view showing the thin film bulk acoustic resonator filter in the case where minimum acoustic damping regions for obtaining a thin film bulk acoustic resonator filter having excellent frequency characteristics are provided. In FIG. 16, an acoustic damping region 50c is formed between the thin film bulk acoustic resonators 1 to 3 and the thin film bulk acoustic resonators 4 and 7, whereas an acoustic damping region 50d is provided between the thin film bulk acoustic resonators 1 to 3 and the thin film bulk acoustic resonators 5 and 6. Note that the thin film bulk acoustic resonators 1 to 3 are connected in series between electrode pads 40a and 40b serving as input/output terminals (hence referred to as "serial resonators"), and that the thin film bulk acoustic resonators 4 and 7 are connected in parallel between electrode pads 40a and 40b (hence referred to as "parallel resonators"). Similarly, the thin film bulk acoustic resonators 5 and 6 are parallel resonators. A serial resonator and a parallel resonator have quite different resonance frequencies. Therefore, by providing acoustic damping regions between resonators having such different resonance frequencies, the influence of the lateral propagation modes can be suppressed and a thin film bulk acoustic resonator filter having good frequency characteristics can be obtained. Each of the acoustic damping regions 50c and 50d as such can be formed by providing a stepped portion on the surface of a relevant portion of the substrate, or roughening the surface of a relevant portion of the substrate, or by using any other producing method as described above.

As long as the equivalent circuit shown in FIG. 14C is formed, the wiring patterns for the upper wiring portions and the lower wiring portions are not limited to those illustrated in FIG. 15 and FIG. 16. As long as a filter is constructed, the equivalent circuit is not limited to that which is illustrated in FIG. 14C. Although it was assumed that the piezoelectric film 160 is formed as a continuous piece, the piezoelectric film composing the acoustic damping regions may be discontinuous with the piezoelectric film composing the resonators.

Although the ninth embodiment illustrates an example where a circular resonator structure is employed as shown in FIGS. 14A, 15, and 16, the present invention is not limited thereto. A polygonal resonator structure may instead be adopted, in which case even more outstanding effects can be obtained.

The first to ninth embodiments illustrate examples where the upper electrodes, the lower electrodes, and the piezoelectric film are in directly overlying relationship with one another. However, it will be appreciated that a dielectric layer(s) or the like may be formed between an upper electrode and the piezoelectric film, and that a dielectric layer(s) or the like may be formed between a lower electrode and the piezoelectric film. In other words, the piezoelectric film only needs to be formed on or above the lower electrode, and the upper electrode only needs to be formed on or above the piezoelectric film.

(Tenth Embodiment)

Figure 17:
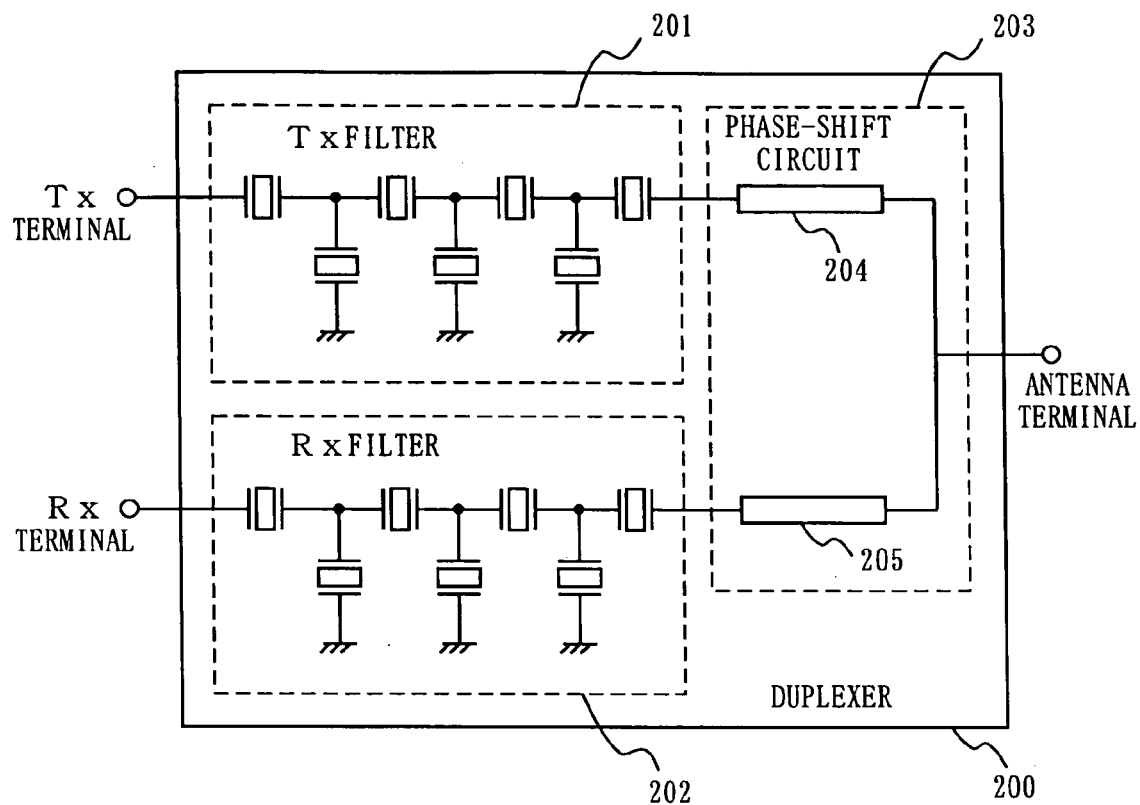
FIG. 17 is an equivalent circuit diagram of a duplexer according to a tenth embodiment of the present invention.
Figure 18:
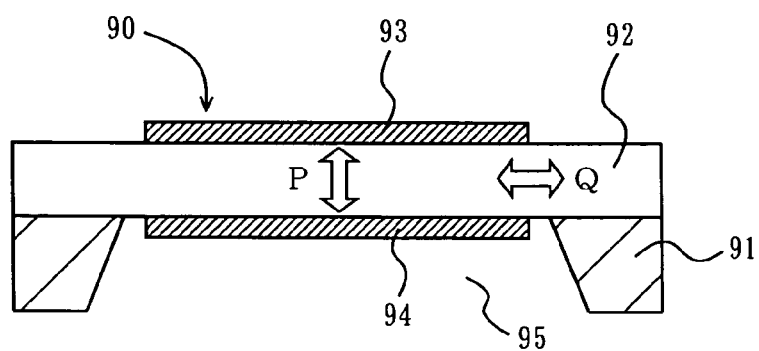
FIG. 18 is a schematic cross-sectional view showing a conventional thin film bulk acoustic resonator.
Figure 19A:
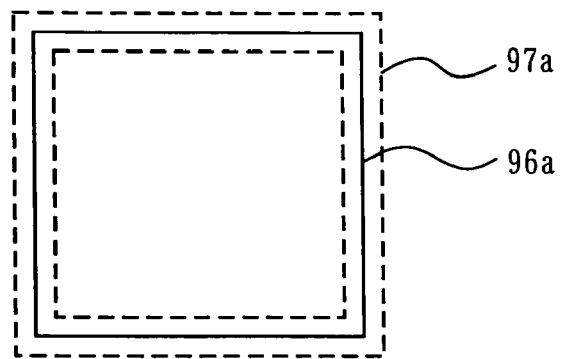
FIG. 19A is a schematic structural diagram showing a conventional thin film bulk acoustic resonator which is disclosed in Japanese Laid-Open Patent No. 2000-31552.
Figure 19B:
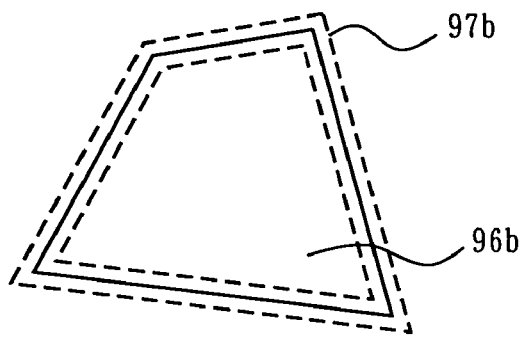
FIG. 19B is a schematic structural diagram showing the conventional thin film bulk acoustic resonator which is disclosed in Japanese Laid-Open Patent No. 2000-31552.
Figure 19C:
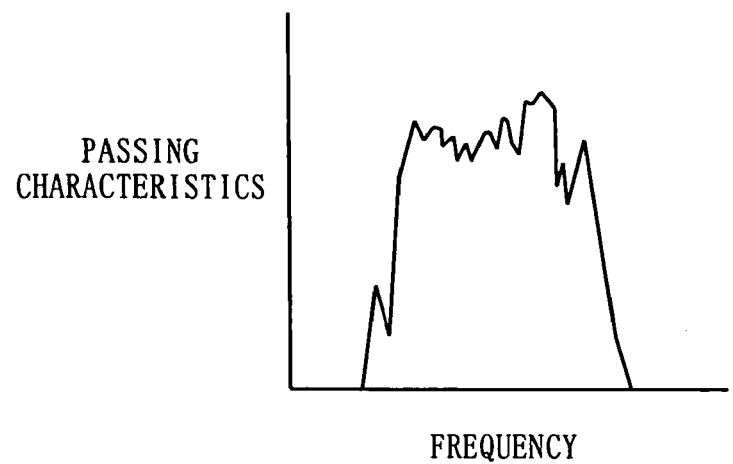
FIG. 19C is a graph showing passing frequency characteristics in the case where neither acoustic damping material 97a or 97b is provided.
Figure 19D:
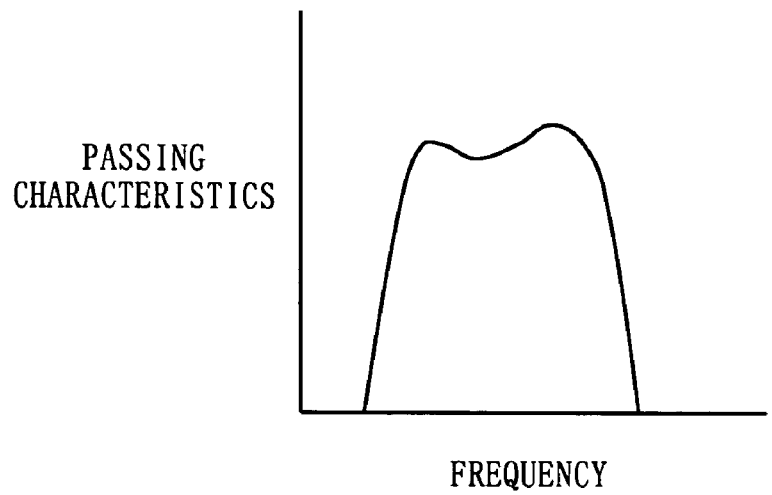
FIG. 19D is a graph showing the passing frequency characteristics in the case where an acoustic damping material 97a or 97b is provided.
Figure 19E:
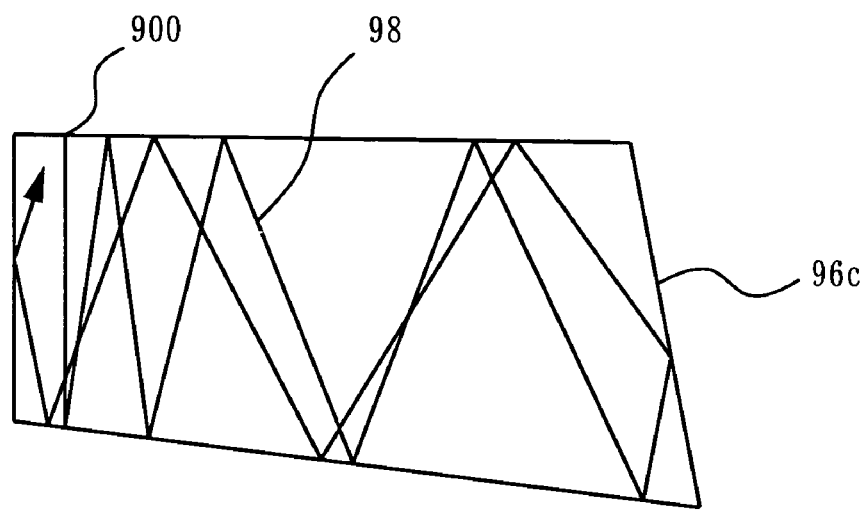
FIG. 19E is a schematic structural diagram showing a conventional thin film bulk acoustic resonator which is disclosed in Japanese Laid-Open Patent No. 2000-332568.

FIG. 17 is an equivalent circuit diagram of a duplexer according to a tenth embodiment of the present invention. In FIG. 17, a duplexer 200 comprises a Tx filter (transmission filter) 201, an Rx filter (reception filter) 202, and a phase-shift circuit 203. The phase-shift circuit 203 may include two transmission lines 204 and 205, for example. The Tx filter 201 and the Rx filter 202 may each include, for example, a thin film bulk acoustic resonator filter as shown in any of FIGS. 14A to 14C, FIG. 15, and FIG. 16. Since each thin film bulk acoustic resonator filter comprises a thin film bulk acoustic resonator having excellent frequency characteristics with the lateral propagation modes being selectively damped as described with respect to the ninth embodiment, improved duplexer characteristics can be provided.

Note that only one of the Tx filter 201 or the Rx filter 202 may include a thin film bulk acoustic resonator filter having excellent frequency characteristics with the lateral propagation modes being selectively damped.

Although the tenth embodiment illustrates a duplexer as an example of a composite electronic component device comprising a thin film bulk acoustic resonator filter(s), the present invention is not limited thereto. The present invention is applicable to any composite electronic component device other than a duplexer, as long as the composite electronic component device comprises a thin film bulk acoustic resonator filter which incorporates a plurality of interconnected thin film bulk acoustic resonators according to the present invention.

By internalizing in a communication device a thin film bulk acoustic resonator filter(s) which incorporates a plurality of interconnected thin film bulk acoustic resonators according to the present invention, the characteristics of the communication device can be improved.

Since the thin film bulk acoustic resonator according to the present invention has excellent frequency characteristics due to suppression of the lateral propagation modes, the thin film bulk acoustic resonator is applicable to mobile devices, communication devices, or the like.

While the invention has been described in detail, the foregoing description is in all aspects illustrative and not restrictive. It is understood that numerous other modifications and variations can be devised without departing from the scope of the invention.

What is claimed is:

1. A thin film bulk acoustic resonator comprising:
a piezoelectric film;
a pair of electrodes between which the piezoelectric film is interposed; and
a resonator portion including the electrodes and a region of the piezoelectric film between the electrodes, wherein the piezoelectric film includes an outer region extending outwards from at least a portion of a periphery of the resonator portion, and the outer region includes, in at least a portion thereof, an acoustic damping region for damping acoustic waves,
and wherein the acoustic damping region, in the piezoelectric film, is composed of the same material as that of any other region of the piezoelectric film, and the acoustic damping region has a lower crystallinity than that of any other region of the piezoelectric film, and
any element immediately underlying the acoustic damping region has a coarser surface than that of a lower one of the pair of electrodes of the resonator portion.

2. A thin film bulk acoustic resonator comprising:
a piezoelectric film:
a pair of electrodes between which the piezoelectric film is interposed; and
a resonator portion including the electrodes and a region of the piezoelectric film between the electrodes, wherein the piezoelectric film includes an outer region extending outwards from at least a portion of a periphery of the resonator portion, and the outer region includes, in at least a portion thereof, an acoustic damping region for damping acoustic waves,
and wherein the acoustic damping region, in the piezoelectric film, is composed of the same material as that of any other region of the piezoelectric film, and the acoustic damping region has a lower crystallinity and a greater full width at half maximum of an X-ray diffraction rocking curve than those of any other region of the piezoelectric film, and the acoustic damping region includes homogenous atoms or heterogenous atoms not existing in any other region of the piezoelectric film.

3. A thin film bulk acoustic resonator comprising:
a piezoelectric film;
a pair of electrodes between which the piezoelectric film is interposed; and
a resonator portion including the electrodes and a region of the piezoelectric film between the electrodes, wherein the piezoelectric film includes an outer region extending outwards from at least a portion of a periphery of the resonator portion, and the outer region includes, in at least a portion thereof, an acoustic damping region for damping acoustic waves,
and wherein the acoustic damping region, in the piezoelectric film, is composed of the same material as that of any other region of the piezoelectric film, and the acoustic damping region has a lower crystallinity and a greater full width at half maximum of an X-ray diffraction rocking curve than those of any other region of the piezoelectric film, and homogenous ions or heterogenous ions not existing in any region of the piezoelectric film other than the acoustic damping region are implanted into the acoustic damping region.

4. A method for producing a thin film bulk acoustic resonator, comprising:
forming a lower electrode on or above a substrate;
roughening a part of a surface of any element immediately underlying a piezoelectric film;
forming the piezoelectric film on or above the lower electrode;
forming an upper electrode on or above the piezoelectric film; and
forming a resonator portion including the upper and lower electrodes and a region of the piezoelectric film between the upper and lower electrodes, wherein,
said forming the piezoelectric film comprises:
forming the piezoelectric film so as to have a region extending outwards from at least a portion of a periphery of the resonator portion; and
ensuring, by forming the piezoelectric film above the part of the surface having been roughened, that at least a portion of the region of the piezoelectric film extending outwards has a lower crystallinity than that of the resonator portion of the piezoelectric film, thereby forming an acoustic damping region for damping acoustic waves.

5. A composite electronic component device comprising a thin film bulk acoustic resonator filter including a plurality of interconnected thin film bulk acoustic resonators, each thin film bulk acoustic resonator including:
a piezoelectric film;
an upper electrode and a lower electrode between which the piezoelectric film is interposed; and
a resonator portion including the upper and lower electrodes and a region of the piezoelectric film between the upper and lower electrodes, wherein
the piezoelectric film in at least one of the plurality of thin film bulk acoustic resonators includes an outer region extending outwards from at least a portion of a periphery of the resonator portion,
the outer region includes, in at least a portion thereof, an acoustic damping region for damping acoustic waves, wherein the acoustic damping region, in the piezoelectric film, is composed of the same material as that of any other region of the piezoelectric film, and the acoustic damping region has a lower crystallinity than that of any other region of the piezoelectric film, and any element immediately underlying the acoustic damping region has a coarser surface than that of the lower one of the pair of electrodes of the resonator portion, and
the acoustic damping region is provided at least between those of the plurality of thin film bulk acoustic resonators having different resonance frequencies.

6. A communication device comprising a thin film bulk acoustic resonator filter including a plurality of interconnected thin film bulk acoustic resonators, each thin film bulk acoustic resonator including:
a piezoelectric film;
an upper electrode and a lower electrode between which the piezoelectric film is interposed; and
a resonator portion including the upper and lower electrodes and a region of the piezoelectric film between the upper and lower electrodes, wherein
the piezoelectric film in at least one of the plurality of thin film bulk acoustic resonators includes an outer region extending outwards from at least a portion of a periphery of the resonator portion,
the outer region includes, in at least a portion thereof, an acoustic damping region for damping acoustic waves, wherein the acoustic damping region, in the piezoelectric film, is composed of the same material as that of any other region of the piezoelectric film, and the acoustic damping region has a lower crystallinity than that of any other region of the piezoelectric film, and any element immediately underlying the acoustic damping region has a coarser surface than that of the lower one of the pair of electrodes of the resonator portion, and
the acoustic damping region is provided at least between those of the plurality of thin film bulk acoustic resonators having different resonance frequencies.

* * * * *